US012598891B2

(12) United States Patent
Kim et al.

(10) Patent No.: US 12,598,891 B2
(45) Date of Patent: Apr. 7, 2026

(54) DISPLAY DEVICE AND METHOD OF MANUFACTURING DISPLAY DEVICE

(71) Applicant: Samsung Display Co., Ltd., Yongin-Si (KR)

(72) Inventors: Hyeonsik Kim, Yongin-si (KR); Dae-Young Lee, Yongin-si (KR); Sangwoo Kim, Yongin-si (KR); Kwang Soo Bae, Yongin-si (KR); Taekyung Ahn, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 451 days.

(21) Appl. No.: 18/102,416

(22) Filed: Jan. 27, 2023

(65) Prior Publication Data

US 2023/0320170 A1 Oct. 5, 2023

(30) Foreign Application Priority Data

Apr. 4, 2022 (KR) ........................ 10-2022-0041760

(51) Int. Cl.
*H10K 50/15* (2023.01)
*G06V 40/13* (2022.01)
(Continued)

(52) U.S. Cl.
CPC ......... *H10K 59/65* (2023.02); *G06V 40/1318* (2022.01); *H10K 50/15* (2023.02);
(Continued)

(58) Field of Classification Search
CPC .. H10K 59/65; H10K 59/1201; H10K 59/122;
H10K 71/00; G06V 40/1318
(Continued)

(56) References Cited

U.S. PATENT DOCUMENTS 9,102,872 B2    8/2015  Ueno et al.
10,079,273 B2   9/2018  Yang et al.
(Continued)

FOREIGN PATENT DOCUMENTS

KR      10-2012-0052948 A     5/2012
KR      10-2013-0033278 A     4/2013
(Continued)

*Primary Examiner* — Dzung Tran
(74) *Attorney, Agent, or Firm* — F. CHAU & ASSOCIATES, LLC

(57) ABSTRACT

A display device includes a circuit layer and an element layer including a light-emitting element, a light sensing element, and an element defining layer. The light-emitting element includes a pixel anode electrode, a pixel hole injection layer disposed on the pixel anode electrode, an emissive layer disposed on the pixel hole injection layer, and a pixel cathode electrode disposed on the emissive layer. The light sensing element includes a sensing anode electrode, a sensing hole injection layer disposed on the sensing anode electrode, a photoelectric conversion layer disposed on the sensing hole injection layer, and a sensing cathode electrode disposed on the photoelectric conversion layer. The pixel hole injection layer and the sensing hole injection layer are electrically insulated from each other, and the pixel cathode electrode and the sensing cathode electrode are electrically connected with each other.

16 Claims, 16 Drawing Sheets

(51) Int. Cl.

| | |
|---|---|
| *H10K 50/16* | (2023.01) |
| *H10K 50/17* | (2023.01) |
| *H10K 59/12* | (2023.01) |
| *H10K 59/122* | (2023.01) |
| *H10K 59/123* | (2023.01) |
| *H10K 59/65* | (2023.01) |
| *H10K 71/00* | (2023.01) |

(52) U.S. Cl.
CPC ........... *H10K 50/16* (2023.02); *H10K 50/171* (2023.02); *H10K 59/1201* (2023.02); *H10K 59/122* (2023.02); *H10K 59/123* (2023.02); *H10K 71/00* (2023.02)

(58) Field of Classification Search
USPC ........................................................... 257/40
See application file for complete search history.

(56) References Cited

U.S. PATENT DOCUMENTS

| | | | | |
|---|---|---|---|---|
| 2014/0350366 A1* | 11/2014 | Akiyama | ............... | H10K 65/00 |
| | | | | 600/328 |
| 2018/0102499 A1* | 4/2018 | Pyo | ..................... | H10K 59/879 |
| 2021/0167229 A1 | 6/2021 | Lee et al. | | |
| 2022/0173174 A1 | 6/2022 | Hatsumi et al. | | |

FOREIGN PATENT DOCUMENTS

| | | |
|---|---|---|
| KR | 10-2018-0013601 | 2/2018 |
| KR | 10-2021-0069778 | 6/2021 |
| KR | 10-2021-0126649 A | 10/2021 |
| WO | 2020165686 | 8/2020 |

* cited by examiner

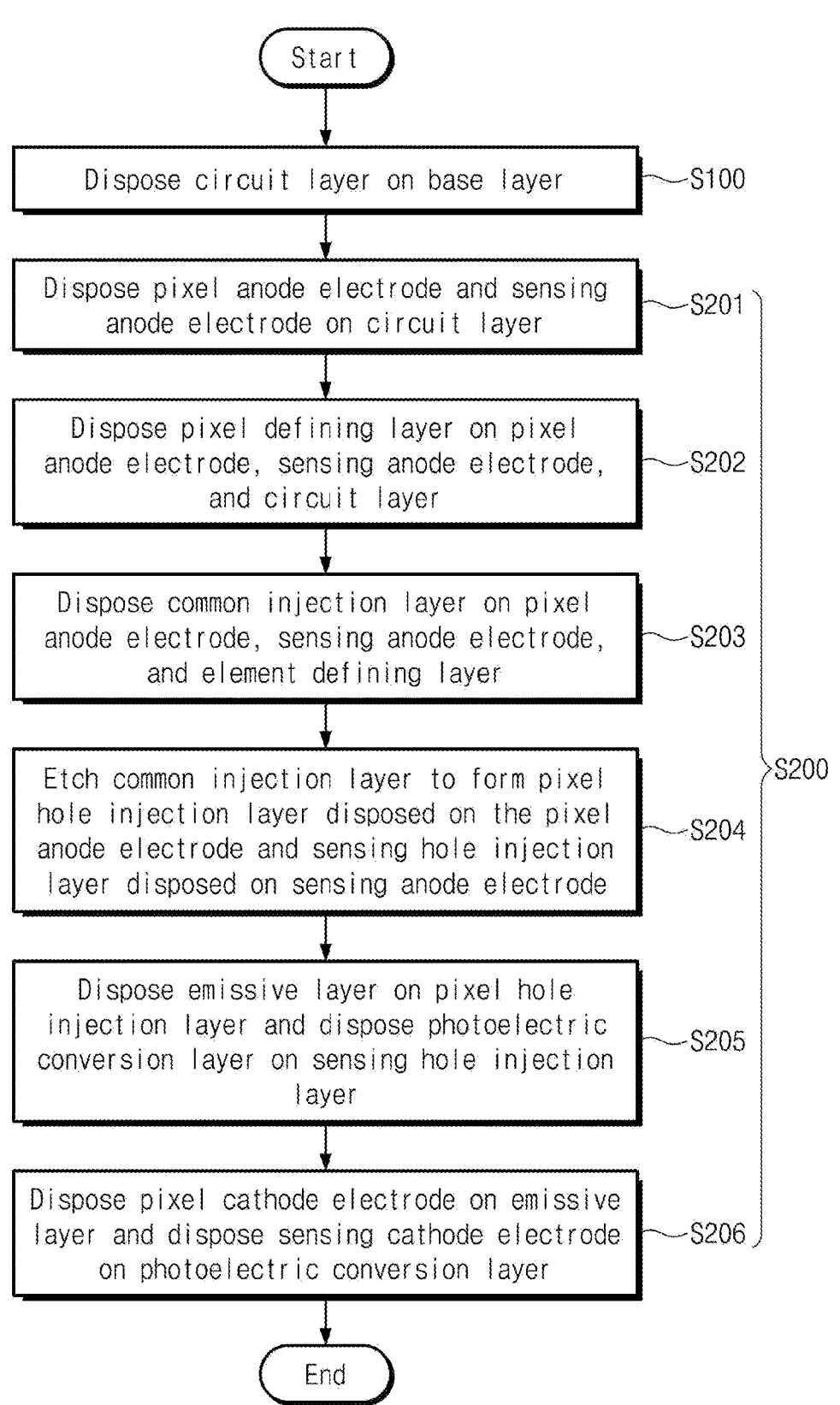

Start

Dispose circuit layer on base layer ⟶ S100

Dispose pixel anode electrode and sensing anode electrode on circuit layer ⟶ S201

Dispose pixel defining layer on pixel anode electrode, sensing anode electrode, and circuit layer ⟶ S202

Dispose common injection layer on pixel anode electrode, sensing anode electrode, and element defining layer ⟶ S203

Etch common injection layer to form pixel hole injection layer disposed on the pixel anode electrode and sensing hole injection layer disposed on sensing anode electrode ⟶ S204

Dispose emissive layer on pixel hole injection layer and dispose photoelectric conversion layer on sensing hole injection layer ⟶ S205

Dispose pixel cathode electrode on emissive layer and dispose sensing cathode electrode on photoelectric conversion layer ⟶ S206

S200

End

FIG. 9C

DISPLAY DEVICE AND METHOD OF MANUFACTURING DISPLAY DEVICE

CROSS-REFERENCE TO RELATED APPLICATION

This application claims priority under 35 U.S.C. § 119 to Korean Patent Application No. 10-2022-0041760 filed on Apr. 4, 2022, in the Korean Intellectual Property Office, the disclosure of which is incorporated by reference herein in its entirety.

TECHNICAL FIELD

Embodiments of the present invention relate to a display device and a method of manufacturing the display device, and more particularly, to a display device capable of increasing the accuracy of sensing biometric information and increasing the quality of display.

DISCUSSION OF THE RELATED ART

Various display devices that are used in multimedia devices such as a television, a mobile phone, a tablet computer, a navigation system, and a game console are currently under development. As display devices are used in various fields, types of display panels for displaying images that the display devices intend to display are also diversifying. A display panel typically includes a light-emitting display panel. The light-emitting display panel may include, for example, an organic light-emitting display panel, an inorganic light-emitting display panel, or a quantum dot light-emitting display panel.

Generally, a display device displays an image to provide information to a user and/or performs various functions, which enable organic communication with the user, such as a function of sensing an input of the user. Currently, display devices may perform a function of sensing biometric information of the user.

SUMMARY

Embodiments of the present invention provide a display device capable of improving the accuracy of sensing biometric information by preventing a noise from occurring in the process of sensing the biometric information.

Embodiments of the present invention provide a method of manufacturing the display device.

According to an embodiment of the present invention, a display device includes a circuit layer, and an element layer disposed on the circuit layer and including a light-emitting element, a light sensing element, and an element defining layer separating the light-emitting element and the light sensing element from each other. The light-emitting element includes a pixel anode electrode electrically connected with the circuit layer, a pixel hole injection layer disposed on the pixel anode electrode, an emissive layer disposed on the pixel hole injection layer, and a pixel cathode electrode disposed on the emissive layer. The light sensing element includes a sensing anode electrode electrically connected with the circuit layer, a sensing hole injection layer disposed on the sensing anode electrode, a photoelectric conversion layer disposed on the sensing hole injection layer, and a sensing cathode electrode disposed on the photoelectric conversion layer. The pixel hole injection layer and the sensing hole injection layer are electrically insulated from each other, and the pixel cathode electrode and the sensing cathode electrode are electrically connected with each other.

In an embodiment of the present invention, the circuit layer includes a pixel driving circuit that is electrically connected with the light-emitting element and controls an operation of the light-emitting element, and a sensing driving circuit that is electrically connected with the light sensing element and controls an operation of the light sensing element.

In an embodiment of the present invention, the light-emitting element and the light sensing element are disposed on the same layer as each other.

In an embodiment of the present invention, the element defining layer includes a bottom surface facing the circuit layer, an upper surface being opposite to the bottom surface, and a side surface connecting the bottom surface and the upper surface to each other.

In an embodiment of the present invention, a portion of the pixel cathode electrode and a portion of the sensing cathode electrode overlap the upper surface and the side surface of the element defining layer. Each of the pixel hole injection layer and the sensing hole injection layer does not overlap the upper surface of the element defining layer.

In an embodiment of the present invention, a portion of the pixel hole injection layer and a portion of the sensing hole injection layer are disposed on the side surface of the element defining layer.

In an embodiment of the present invention, each of the pixel hole injection layer and the sensing hole injection layer does not overlap the bottom surface of the element defining layer.

In an embodiment of the present invention, each of the pixel hole injection layer and the sensing hole injection layer is not in contact with the bottom surface of the element defining layer.

In an embodiment of the present invention, the light-emitting element further includes a pixel hole transport layer disposed between the pixel hole injection layer and the emissive layer. The light sensing element further includes a sensing hole transport layer disposed between the sensing hole injection layer and the photoelectric conversion layer.

In an embodiment of the present invention, the pixel hole transport layer and the sensing hole transport layer are electrically insulated from each other.

In an embodiment of the present invention, the pixel hole transport layer and the sensing hole transport layer are electrically connected with each other.

In an embodiment of the present invention, the light-emitting element further includes a pixel electron transport layer disposed between the emissive layer and the pixel cathode electrode. The light sensing element further includes a sensing electron transport layer disposed between the photoelectric conversion layer and the sensing cathode electrode. The pixel electron transport layer and the sensing electron transport layer are electrically connected with each other.

In an embodiment of the present invention, the light-emitting element further includes a pixel electron injection layer disposed between the pixel electron transport layer and the pixel cathode electrode. The light sensing element further includes a sensing electron injection layer disposed between the photoelectric conversion layer and the sensing cathode electrode. The pixel electron transport layer and the sensing electron transport layer are electrically connected with each other.

In an embodiment of the present invention, an absolute value of a workfunction of the pixel hole injection layer is greater than an absolute value of a workfunction of the pixel anode electrode. An absolute value of a workfunction of the sensing hole injection layer is greater than an absolute value of a workfunction of the sensing anode electrode. Each of the pixel hole injection layer and the sensing hole injection layer includes metal oxide.

In an embodiment of the present invention, each of the pixel hole injection layer and the sensing hole injection layer includes tungsten oxide.

In an embodiment of the present invention, each of the pixel hole injection layer and the sensing hole injection layer includes molybdenum oxide.

According to an embodiment of the present invention, a method of manufacturing a display device includes disposing a circuit layer on a base layer, and disposing an element layer on the circuit layer. The element layer includes a light-emitting element, a light sensing element, and an element defining layer separating the light-emitting element and the light sensing element from each other. The disposing of the element layer includes disposing a pixel anode electrode and a sensing anode electrode on the circuit layer, disposing the element defining layer on the pixel anode electrode, the sensing anode electrode, and the circuit layer, disposing a common injection layer on the pixel anode electrode, the sensing anode electrode, and the element defining layer, etching the common injection layer to form a pixel hole injection layer and a sensing hole injection layer. The pixel hole injection is disposed on the pixel anode electrode, and the sensing hole injection layer is disposed on the sensing anode electrode. The disposing of the element layer further includes disposing an emissive layer on the pixel hole injection layer, disposing a photoelectric conversion layer on the sensing hole injection layer, disposing a pixel cathode electrode on the emissive layer, and disposing a sensing cathode electrode on the photoelectric conversion layer.

In an embodiment of the present invention, the forming of the pixel hole injection layer and the sensing hole injection layer includes forming a photoresist on the common injection layer, emitting a light to the photoresist by using a patterned mask, developing the irradiated photoresist to expose a portion of the common injection layer, and etching the exposed portion of the common injection layer to form the pixel hole injection layer and the sensing hole injection layer.

In an embodiment of the present invention, the exposed portion of the common injection layer overlaps the element defining layer.

In an embodiment of the present invention, the pixel hole injection layer and the sensing hole injection layer are electrically insulated from each other. The pixel cathode electrode and the sensing cathode electrode are electrically connected with each other.

BRIEF DESCRIPTION OF THE DRAWINGS

The above and other features of the present invention will become apparent by describing in detail embodiments thereof with reference to the accompanying drawings, in which:

FIGS. 7A, 7B and 7C are enlarged cross-sectional views of a display panel in area AA' illustrated in FIG. 6.

FIG. 8A is a flowchart illustrating a method of describing a display device manufacturing method according to an embodiment of the present invention.

FIGS. 9A, 9B, 9C, 9D, 9E, and 9F are cross-sectional views for describing how a pixel hole injection layer and a sensing hole injection layer are formed, according to an embodiment of the present invention.

DETAILED DESCRIPTION OF THE EMBODIMENTS

Figure 1:
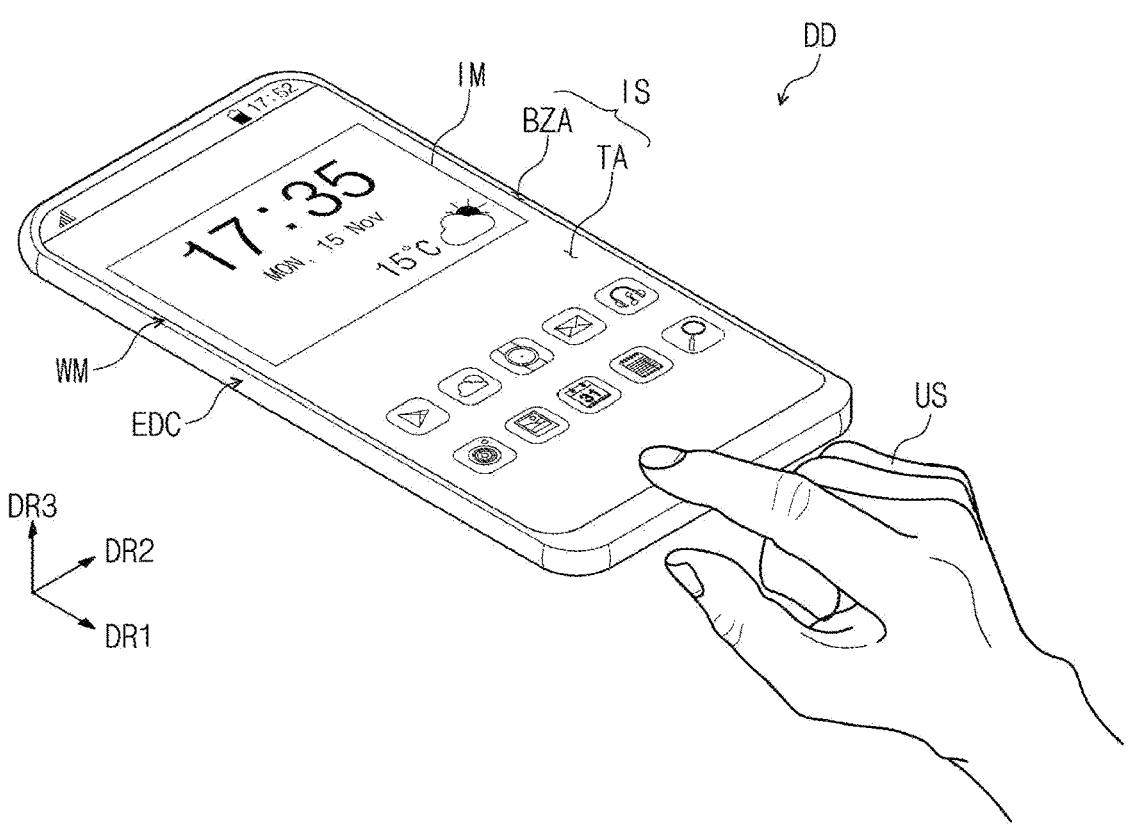
FIG. 1 is a perspective view illustrating a display device according to an embodiment of the present invention.

In the specification, the expression that a first component (or, e.g., area, layer, part, portion, etc.) is "on", "connected with", or "coupled to" a second component means that the first component is directly on, connected with, or coupled to the second component or that a third component is interposed therebetween.

The same reference numeral refers to the same component throughout the specification. In the drawings, various thicknesses, lengths, and angles are shown and while the arrangement shown does indeed represent an embodiment of the present invention, it is to be understood that modifications of the various thicknesses, lengths, and angles may be possible within the spirit and scope of the present invention and the present invention is not necessarily limited to the particular thicknesses, lengths, and angles shown. The expression "and/or" includes one or more combinations of one or more of the associated listed items.

Although the terms "first", "second", etc. may be used to describe various components, the components should not be construed as being limited by the terms. The terms are only used to distinguish one component from another component. For example, without departing from the scope and spirit of the present invention, a first component may be referred to as a "second component", and similarly, the second component may be referred to as the "first component". The singular forms are intended to include the plural forms unless the context clearly indicates otherwise.

In addition, the terms "under", "below", "on", "above", etc. are used to describe the correlation of components illustrated in drawings. The terms are relative and are described with reference to a direction indicated in the drawing. It will be understood that the spatially relative terms are intended to encompass different orientations of the device in use or operation in addition to the orientation depicted in the figures. For example, if the device in the figures is turned over, components described as "below" or "beneath" other components or features would then be oriented "above" the other components or features.

Below, embodiments of the present invention will be described with reference to accompanying drawings.

Figure 2:
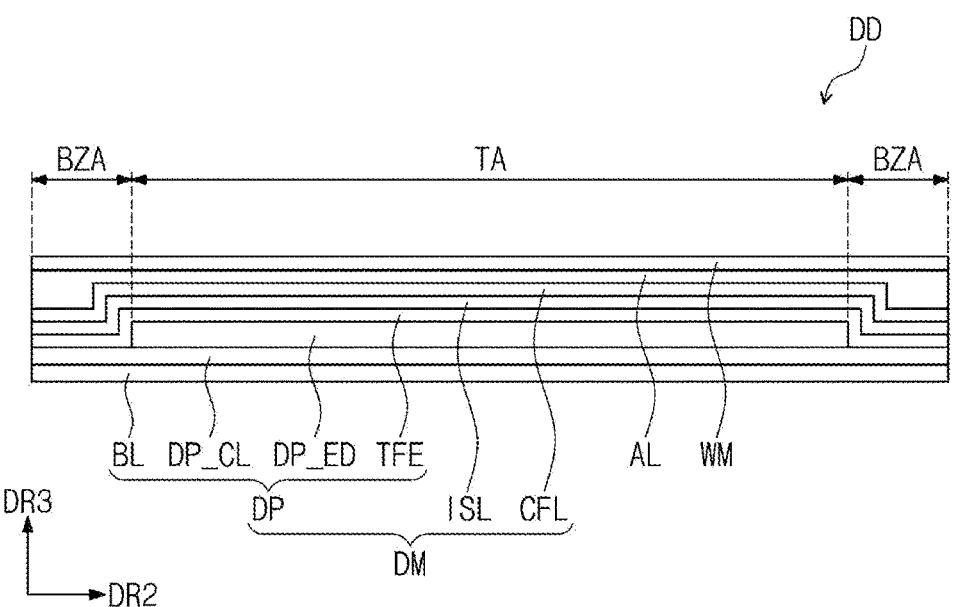
FIG. 2 is a cross-sectional view of a display device according to an embodiment of the present invention.

FIG. 1 is a perspective view of a display device according to an embodiment of the present invention, and FIG. 2 is a cross-sectional view of a display device according to an embodiment of the present invention.

Referring to FIG. 1, a display device DD may be a device that is activated depending on or in response to an electrical signal. An example in which the display device DD is a smartphone is illustrated in FIG. 1. However, the present invention is not limited thereto. For example, as well as a large-sized display device, such as a television or a monitor, the display device DD may be a small and medium-sized display device such as a tablet PC, a notebook computer, a vehicle navigation system, or a game console. The above examples are provided as an embodiment, and it is obvious that the display device DD may be implemented with any other display device(s) without departing from the spirit and scope of the present invention.

For example, the display device DD has a long side (or edge) in a first direction DR1 and has a short side (or edge) in a second direction DR2 intersecting the first direction DR1. The display device DD has a quadrangle shape whose corners are rounded. However, the shape of the display device DD is not limited thereto. For example, the display device DD may be implemented in various shapes (e.g., in the shape of a circle). The display device DD may display an image IM on a display surface IS that is parallel to each of the first direction DR1 and the second direction DR2, so as to face a third direction DR3. The display surface IS on which the image IM is displayed may correspond to a front surface of the display device DD. In the specification, the meaning of "when viewed from above a plane" may mean "when viewed in the third direction DR3".

In this embodiment, a front surface (or an upper/top surface) and a rear surface (or a lower/bottom surface) of each member are defined with respect to a direction in which the image IM is displayed. The front surface and the rear surface may be opposite to each other in the third direction DR3, and the normal direction of each of the front surface and the rear surface may be parallel to the third direction DR3.

A separation distance between the front surface and the rear surface in the third direction DR3 may correspond to a thickness of the display device DD in the third direction DR3. In addition, directions that the first, second, and third directions DR1, DR2, and DR3 indicate may be relative in concept and may be changed to different directions.

The display surface IS of the display device DD may be divided into a transparent area TA and a bezel area BZA. The transparent area TA may be an area in which the image IM is displayed. A user US visually perceives the image IM through the transparent area TA. In this embodiment, the transparent area TA is illustrated in the shape of a quadrangle whose vertexes are rounded. However, this is illustrated as an example and the present invention is not limited thereto. The transparent area TA may have various shapes and might not be limited to any one embodiment.

The bezel area BZA is adjacent to the transparent area TA. The bezel area BZA may have a predetermined color (e.g., black). The bezel area BZA may at least partially surround the transparent area TA. As such, a shape of the transparent area TA may be defined substantially by the bezel area BZA. However, this is illustrated as an example. For example, the bezel area BZA may be disposed adjacent to only one side of the transparent area TA or may be omitted. The display device DD according to an embodiment of the present invention may include various embodiments and is not limited to any one embodiment.

The display device DD may sense an external input applied from the outside. The external input may include various types of inputs that are provided from the outside of the display device DD. For example, the external input may be one of various types of external inputs, such as a part of a body of the user US (e.g., a hand of the user US), a light, heat, and pressure, or a combination thereof. In this embodiment, an example in which a part of the body of the user US is a touch input by a hand of the user US is described, but the present invention is not limited thereto. For example, as described above, a part of the body of the user US may be provided in various manners. In addition, the display device DD may sense an input of the user US applied to a side surface or a rear surface of the display device DD depending on a structure of the display device DD and is not limited to one embodiment.

The display device DD may sense biometric information of the user US applied from the outside. A biometric information sensing area capable of sensing biometric information of the user US may be provided on the display surface IS of the display device DD. The biometric information sensing area may be provided in the whole transparent area TA or may be provided in a portion of the transparent area TA. An example of the present invention is illustrated in FIG. 1 as the whole transparent area TA is utilized as the biometric information sensing area.

Referring to FIGS. 1 and 2, the display device DD may include a window WM, a display module DM, and a housing EDC. In this embodiment, the window WM and the housing EDC are coupled to each other to form the exterior of the display device DD.

A front surface of the window WM defines the display surface IS of the display device DD. The window WM may be formed of a transparent material capable of outputting the image IM. The window WM may include an optically transparent material. For example, the window WM may include glass or plastic. The window WM may include a multi-layer structure or a single-layer structure. For example, the window WM may include a plurality of plastic films bonded by an adhesive or may have a glass substrate and a plastic film bonded by an adhesive.

The display module DM may include a display panel DP and an input sensing layer ISL. The display panel DP may display the image IM depending on an electrical signal, and the input sensing layer ISL may sense an external input applied from the outside. The external input may be provided in various forms.

The display panel DP according to an embodiment of the present invention may be a light-emitting display panel and is not particularly limited thereto. For example, the display panel DP may be an organic light-emitting display panel, an inorganic light-emitting display panel, or a quantum dot light-emitting display panel. A light-emitting layer of the organic light-emitting display panel may include an organic light emitting material, and a light-emitting layer of the inorganic light-emitting display panel may include an inorganic light emitting material. A light-emitting layer of the quantum dot light-emitting display panel may include a quantum dot, a quantum rod, or the like. Hereinafter, the description will be given under the condition that the display panel DP is an organic light-emitting display panel.

The display panel DP includes a base layer BL, a circuit layer DP_CL, an element layer DP_ED, and an encapsulation layer TFE. The display panel DP according to the present invention may be a flexible display panel. However, the present invention is not limited thereto. For example, the display panel DP may be a foldable display panel, which is folded about a folding axis, or a rigid display panel.

The base layer BL may include a synthetic resin layer. The synthetic resin layer may be, for example, a polyimide-based resin layer, and a material thereof is not specifically limited. For example, the base layer BL may include a glass substrate, a metal substrate, an organic/inorganic composite material substrate, or the like.

The circuit layer DP_CL is disposed between the base layer BL and the element layer DP_ED. The circuit layer DP_CL includes at least one insulating layer and a circuit element. Below, the insulating layer included in the circuit layer DP_CL is referred to as an "intermediate insulating layer". The intermediate insulating layer includes at least one intermediate inorganic film and at least one intermediate organic film. The circuit element may include a pixel driving circuit PDC (refer to FIG. 5) and sensing driving circuit SDC (refer to FIG. 5). The pixel driving circuit PDC (refer to FIG. 5) is included in each of a plurality of pixels PX (refer to FIG. 3) for displaying the image IM, and the sensing driving circuit SDC (refer to FIG. 5) included in each of a plurality of photosensors FX (refer to FIG. 3) for recognizing external information. The external information may be biometric information of the user US. As an example of the present invention, the photosensor FX may include a fingerprint recognition sensor, a proximity sensor, an iris recognition sensor, or the like. In addition, the photosensor FX may include an optical sensor that recognizes biometric information in an optical manner. As an example of the present invention, the circuit layer DP_CL may further include signal lines connected with the pixel driving circuit and the sensor driving circuit.

The element layer DP_ED may include a light-emitting element ED (refer to FIG. 5), which is included in each of the pixels PX, and a light sensing element OPD (refer to FIG. 5), which is included in each of the photosensors FX. As an example of the present invention, the light sensing element OPD may be a photodiode. The light sensing element OPD may be a sensor that reacts to a light reflected by the body of the user US or a light penetrating the body of the user US. As an example of the present invention, the light-emitting element ED and the light sensing element OPD are disposed on the same layer. For example, each of the light-emitting element ED and the light sensing element OPD may be disposed on the circuit layer DP_CL. The circuit layer DP_CL and the element layer DP_ED will be described in detail with reference to FIGS. 5 and 6.

The encapsulation layer TFE encapsulates or covers the element layer DP_ED. The encapsulation layer TFE may include at least one organic film and at least one inorganic film. The inorganic film may include an inorganic material and may protect the element layer DP_ED from moisture/oxygen. The inorganic film may include, for example, a silicon nitride layer, a silicon oxynitride layer, a silicon oxide layer, a titanium oxide layer, an aluminum oxide layer, or the like, but is not specially limited thereto. The organic film may include an organic material and may protect the element layer DP_ED from foreign objects such as dust particles.

The input sensing layer ISL may be formed on the display panel DP. For example, the input sensing layer ISL may be directly disposed on the encapsulation layer TFE. According to an embodiment of the present invention, the input sensing layer ISL may be formed on the display panel DP through a subsequent process. For example, when the input sensing layer ISL is directly disposed on the display panel DP, an adhesive film is not disposed between the input sensing layer ISL and the encapsulation layer TFE. In addition, an adhesive film may be disposed between the input sensing layer ISL and the display panel DP. In this case, the input sensing layer ISL is not manufactured by a process continuous to that of the display panel DP. For example, the input sensing layer ISL may be manufactured through a process separate from that of the display panel DP and may then be fixed on an upper surface of the display panel DP by the adhesive film.

The input sensing layer ISL may sense an external input (e.g., a touch of the user US), may change the sensed input into a given input signal, and may provide the input signal to the display panel DP. The input sensing layer ISL may include a plurality of sensing electrodes for sensing an external input. The sensing electrodes may sense the external input in a capacitive manner. The display panel DP may receive the input signal from the input sensing layer ISL and may generate an image corresponding to the input signal.

The display module DM may further include a color filter layer CFL. For example, the color filter layer CFL may be disposed on the input sensing layer ISL. However, the present invention is not limited thereto. The color filter layer CFL may be disposed between the display panel DP and the input sensing layer ISL. For example, the color filter layer CFL may include a plurality of color filters and a black matrix.

The display device DD according to an embodiment of the present invention may further include an adhesive layer AL. The window WM may be attached to the input sensing layer ISL by the adhesive layer AL. For example, the adhesive layer AL may include an optical clear adhesive, an optically clear adhesive resin, or a pressure sensitive adhesive (PSA).

The housing EDC may be coupled to the window WM to form the exterior of the display device DD. The housing EDC is coupled to the window WM to provide a given inner space. The display module DM may be accommodated in the inner space. The housing EDC may include a material whose rigidity is relatively high. For example, the housing EDC may include glass, plastic, and/or metal or may include a plurality of frames and/or plates that are composed of a combination thereof. The housing EDC may stably protect components of the display device DD accommodated in the inner space from an external impact. A battery module for supplying power for an overall operation of the display device DD may be disposed between the display module DM and the housing EDC.

Figure 3:
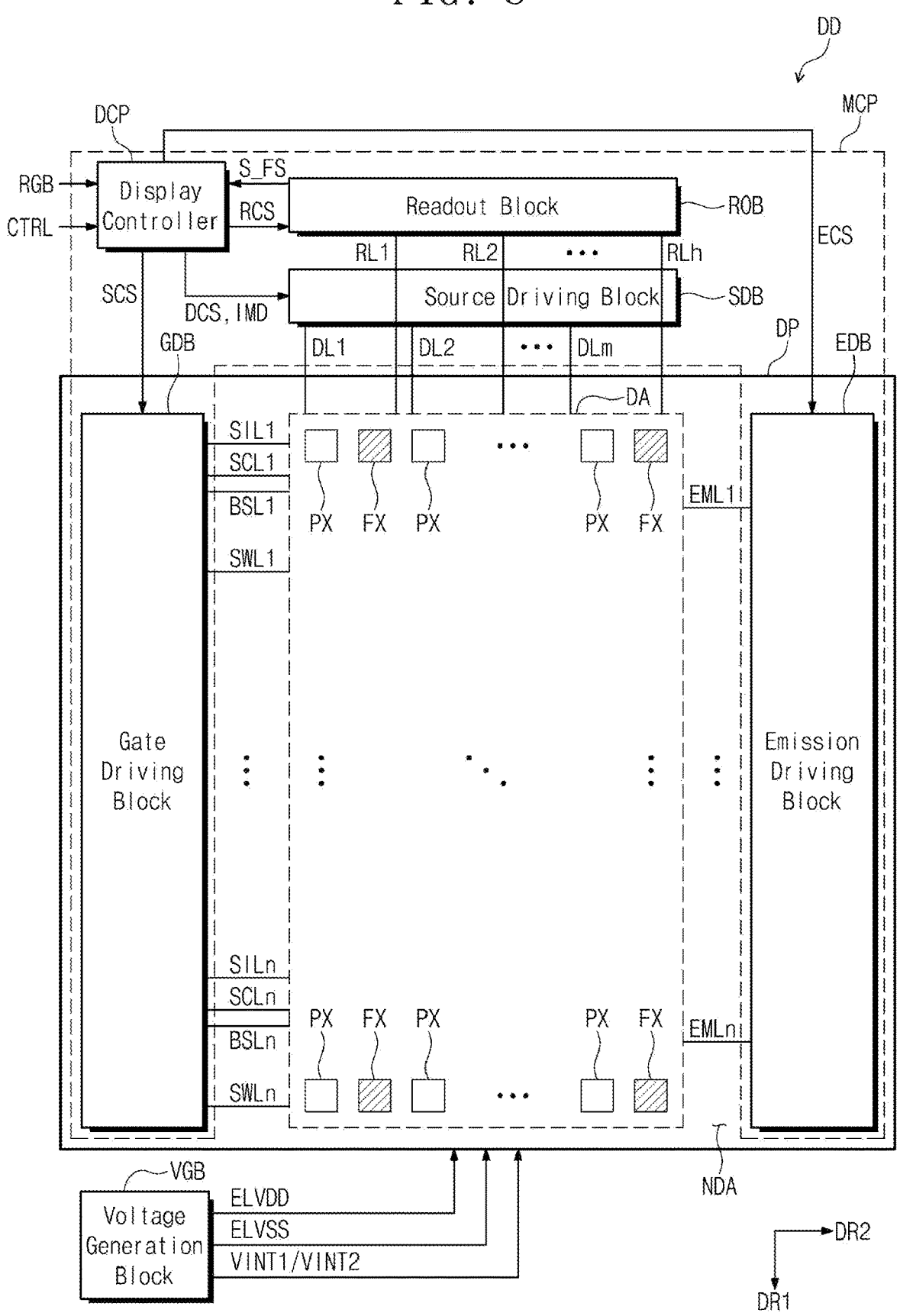
FIG. 3 is a block diagram of a display device according to an embodiment of the present invention.

FIG. 3 is a block diagram of a display device according to an embodiment of the present invention.

Referring to FIG. 3, the display device DD includes the display panel DP and a control module MCP. As an embodiment of the present invention, the control module MCP includes a display controller DCP, a source driving block SDB, a gate driving block GDB, an emission driving block EDB, a voltage generation block VGB, and a readout block ROB.

The control module MCP controls an operation of the display panel DP. For example, the display controller DCP included in the control module MCP receives an image signal RGB and an external control signal CTRL. The display controller DCP generates an image data signal IMD by converting a data format of the image signal RGB in compliance with the specification for an interface with the source driving block SDB. The display controller DCP generates a gate driving signal SCS, a source driving signal DCS, an emission control signal ECS, and a read control signal RCS based on the external control signal CTRL.

The source driving block SDB receives the source driving signal DCS and the image data signal IMD from the display controller DCP. The source driving block SDB converts the image data signal IMD into data signals and outputs the data signals to a plurality of data lines DL1 to DLm to be described later. The data signals refer to analog voltages corresponding to a gray scale value of the image data signal IMD.

The gate driving block GDB receives the gate driving signal SCS from the display controller DCP. The gate driving block GDB may output scan signals to a plurality of scan lines to be described later, in response to the gate driving signal SCS.

The voltage generation block VGB generates voltages that are for the operation of the display panel DP. In an embodiment of the present invention, the voltage generation block VGB generates a first driving voltage ELVDD, a second driving voltage ELVSS, a first initialization voltage VINT1, and a second initialization voltage VINT2. For example, the voltage generation block VGB may operate under control of the display controller DCP. For example, a voltage level of the first driving voltage ELVDD is higher than a voltage level of the second driving voltage ELVSS. Voltage levels of the first and second initialization voltages VINT1 and VINT2 are lower than the voltage level of the second driving voltage ELVSS. However, the present invention is not limited thereto. For example, the voltage levels and magnitudes of the first driving voltage ELVDD, the second driving voltage ELVSS, and the first and second initialization voltages VINT1 and VINT2, which are generated by the voltage generation block VGB, may vary depending on shapes of the display device DD and the display panel DP.

The display panel DP may include a display area DA, which corresponds to the transparent area TA (refer to FIG. 1), and a non-display area NDA, which corresponds to the bezel area BZA (refer to FIG. 1).

The display panel DP may include the plurality of pixels PX, which are disposed in the display area DA, and the plurality of photosensors FX, which are disposed in the display area DA. For example, each of the plurality of photosensors FX may be disposed between two pixels PX that are adjacent to each other. The plurality of pixels PX and the plurality of photosensors FX may be alternately disposed in the first and second directions DR1 and DR2. However, the present invention is not limited thereto. Two or more pixels PX may be disposed between two photosensors FX in the first direction DR1 from among the plurality of photosensors FX, and/or two or more pixels PX may be disposed between two photosensors FX in the second direction DR2 from among the plurality of photosensors FX.

The display panel DP further includes a plurality of initialization scan lines SIL1 to SILn, a plurality of compensation scan lines SCL1 to SCLn, a plurality of write scan lines SWL1 to SWLn, a plurality of black scan lines BSL1 to BSLn, a plurality of emission control lines EML1 to EMLn, the plurality of data lines DL1 to DLm, and a plurality of sensing lines RL1 to RLh. The initialization scan lines SIL1 to SILn, the compensation scan lines SCL1 to SCLn, the write scan lines SWL1 to SWLn, the black scan lines BSL1 to BSLn, and the emission control lines EML1 to EMLn extend in the second direction DR2. The initialization scan lines SIL1 to SILn, the compensation scan lines SCL1 to SCLn, the write scan lines SWL1 to SWLn, the black scan lines BSL1 to BSLn, and the emission control lines EML1 to EMLn are arranged to be spaced from each other in the first direction DR1. The data lines DL1 to DLm and the sensing lines RL1 to RLh extend in the first direction DR1 and are arranged to be spaced from each other in the second direction DR2.

The plurality of pixels PX are electrically connected with the initialization scan lines SIL1 to SILn, the compensation scan lines SCL1 to SCLn, the write scan lines SWL1 to SWLn, the black scan lines BSL1 to BSLn, the emission control lines EML1 to EMLn, and the data lines DL1 to DLm. For example, each of the plurality of pixels PX may be electrically connected with four scan lines. However, the number of scan lines connected with each pixel PX is not limited thereto and may be changed.

The plurality of photosensors FX may be electrically connected with the compensation scan lines SCL1 to SCLn, the write scan lines SWL1 to SWLn, and the sensing lines RL1 to RLh. However, the present invention is not limited thereto. The number of lines connected with each photosensor FX may be variable. For example, the number of sensing lines RL1 to RLh may correspond to one-half of the number of data lines DL1 to DLm. However, the present invention is not limited thereto. In addition, the number of sensing lines RL1 to RLh may correspond to ¼ or ⅛ of the number of data lines DL1 to DLm.

The gate driving block GDB may be disposed in the non-display area NDA of the display panel DP. The gate driving block GDB receives the gate driving signal SCS from the display controller DCP. In response to the gate driving signal SCS, the gate driving block GDB outputs initialization scan signals to the initialization scan lines SIL1 to SILn and outputs compensation scan signals to the compensation scan lines SCL1 to SCLn. For example, the gate driving block GDB may sequentially supply the initialization scan signals to the initialization scan lines SIL1 to SILn and may sequentially supply the compensation scan signals to the compensation scan lines SCL1 to SCLn. In addition, in response to the gate driving signal SCS, the gate driving block GDB may output write scan signals to the write scan lines SWL1 to SWLn and may output black scan signals to the black scan lines BSL1 to BSLn. For example, the gate driving block GDB may sequentially supply the write scan signals to the write scan lines SWL1 to SWLn and may sequentially supply the black scan signals to the black scan lines BSL1 to BSLn.

In addition, the gate driving block GDB may include a first gate driving block and a second gate driving block. The first gate driving block may output the initialization scan signals and the compensation scan signals, and the second gate driving block may output the write scan signals and the black scan signals.

The emission driving block EDB may be disposed in the non-display area NDA of the display panel DP. The emission driving block EDB receives the emission control signal ECS from the display controller DCP. The emission driving block EDB may output emission control signals to the emission control lines EML1 to EMLn in response to the emission control signal ECS. In addition, the gate driving block GDB may be connected with the emission control lines EML1 to EMLn. In this case, the emission driving block EDB may be omitted, and the gate driving block GDB may output the emission control signals to the emission control lines EML1 to EMLn.

The readout block ROB receives the read control signal RCS from the display controller DCP. The readout block ROB may receive sensing signals S_FS from the sensing lines RL1 to RLh in response to the read control signal RCS. The readout block ROB provides the received sensing signals S_FS to the display controller DCP. The display controller DCP calculates biometric information of the user US based on the sensing signals S_FS. For example, the display controller DCP specifies a kind of biometric information of the user US, which is targeted for measurement, based on a setting signal, and calculates the specified biometric information of the user US based on the received sensing signals S_FS.

Figure 4:
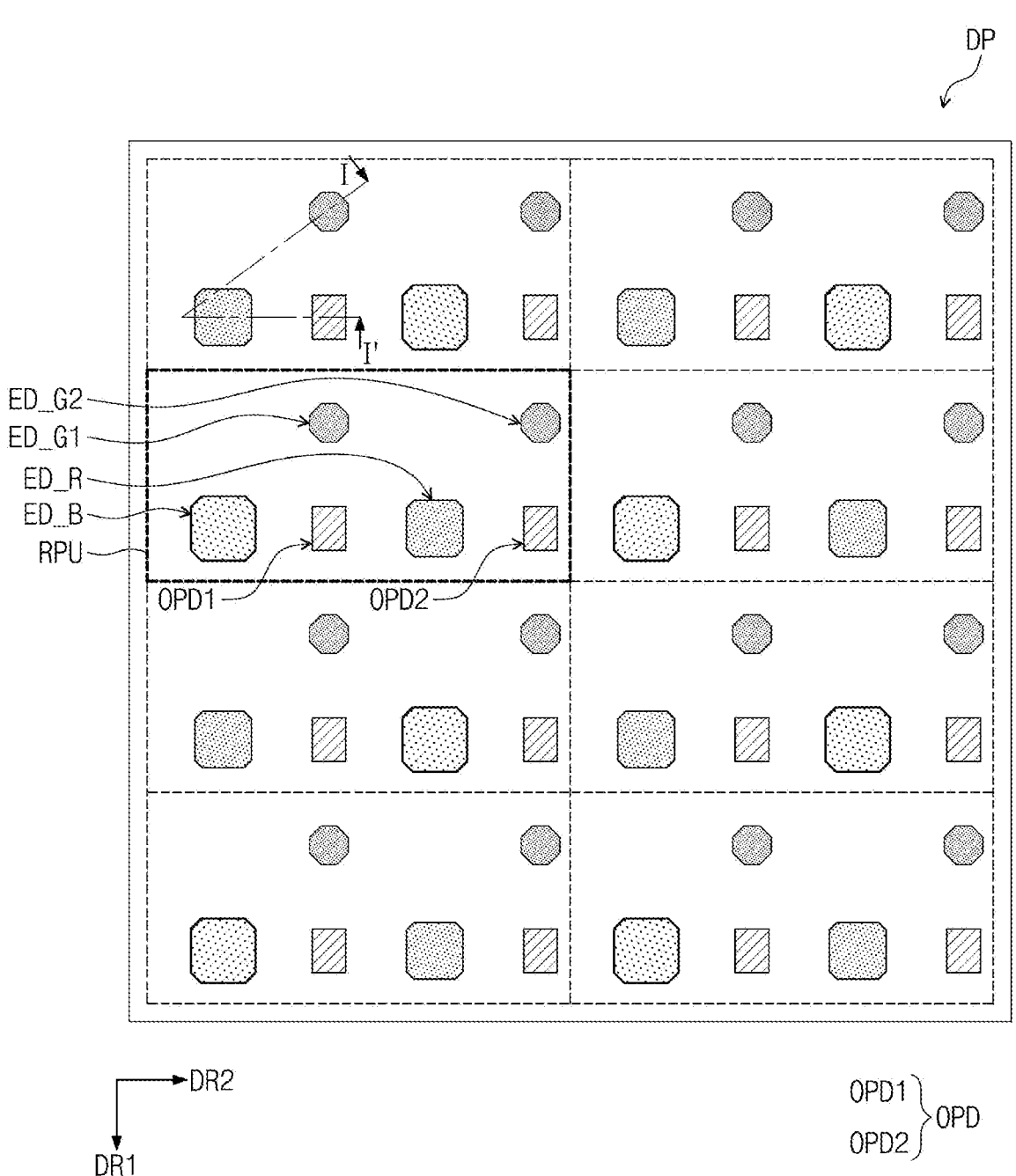
FIG. 4 is an enlarged plan view of a partial area of a display panel according to an embodiment of the present invention.

FIG. 4 is an enlarged plan view of a partial area of a display panel according to an embodiment of the present invention.

Referring to FIGS. 3 and 4, the display panel DP includes the plurality of pixels PX and the plurality of photosensors FX.

The plurality of pixels PX may be grouped into a plurality of reference pixel units RPU that are repeated. For example, each reference pixel unit RPU may include four pixels, that is, a first pixel (hereinafter referred to as a "red pixel"), two second pixels (hereinafter referred to as "first and second green pixels"), and a third pixel (hereinafter referred to as a "blue pixel"). However, the number of pixels included in each reference pixel unit RPU is not limited thereto. In addition, each reference pixel unit RPU may include three pixels, that is, a red pixel, a first green pixel (or a second green pixel), and a blue pixel.

The red pixel includes a first light-emitting element ED_R (hereinafter referred to as a "red light-emitting element"), the first green pixel includes a second light-emitting element ED_G1 (hereinafter referred to as a "first green light-emitting element"), the second green pixel includes a second light-emitting element ED_G2 (hereinafter referred to as a "second green light-emitting element"), and the blue pixel includes a third light-emitting element ED_B (hereinafter referred to as a "blue light-emitting element"). For example, the red light-emitting element ED_R outputs a first color light (e.g., a red light). Further, each of the first and second green light-emitting elements ED_G1 and ED_G2 outputs a second color light (e.g., a green light), and the blue light-emitting element ED_B outputs a third color light (e.g., a blue light).

The red light-emitting element ED_R and the blue light-emitting element ED_B may be disposed repeatedly and alternately in the first direction DR1 and the second direction DR2. The first and second green light-emitting elements ED_G1 and ED_G2 may be disposed on the same row. The first green light-emitting elements ED_G1 may be arranged along the first direction DR1, and the second green light-emitting elements ED_G2 may be arranged along the first direction DR1. The first green light-emitting elements ED_G1 may be disposed in a column different from that of the second green light-emitting elements ED_G2. The first and second green light-emitting elements ED_G1 and ED_G2 may be arranged alternately along the second direction DR2. When viewed from above a plane defined by the first and second directions DR1 and DR2, rows and columns on which the first and second green light-emitting elements ED_G1 and ED_G2 are disposed may be different from rows and columns on which the red light-emitting elements ED_R and the blue light-emitting elements ED_B are disposed.

For example, the red light-emitting element ED_R may be larger in size than the first and second green light-emitting elements ED_G1 and ED_G2. In addition, the blue light-emitting element ED_B may be larger in size than the red light-emitting element ED_R or may be identical in size to the red light-emitting element ED_R. The size of each of the light-emitting elements ED_R, ED_G1, ED_G2, and ED_B is not limited thereto, and may be variously modified. For example, as an embodiment of the present invention, the light-emitting elements ED_R, ED_G1, ED_G2, and ED_B may have the same size as one another.

The first and second green light-emitting elements ED_G1 and ED_G2 may have the same shape as the red and blue light-emitting elements ED_R and ED_B. For example, each of the red and blue light-emitting elements ED_R and ED_B may be in the shape of an octagon where a length in the first direction DR1 and a length in the second direction DR2 are substantially identical to each other. For example, the red and blue light-emitting elements ED_R and ED_B have the same or different sizes from each other but have the same shape as each other.

Each of the first and second green light-emitting elements ED_G1 and ED_G2 may be in the shape of an octagon where a length in the first direction DR1 and a length in the second direction DR2 are substantially identical to each other. As an example of the present invention, the first and second green light-emitting elements ED_G1 and ED_G2 have the same size and the same shape as each other. However, the shapes of the light-emitting elements ED_R, ED_G1, ED_G2, and ED_B are not limited thereto. The shape of each of the light-emitting elements ED_R, ED_G1, ED_G2, and ED_B may be variously changed and modified. For example, each of the light-emitting elements ED_R, ED_G1, ED_G2, and ED_B may be in the shape of a circle, a rectangle, or a diamond.

The plurality of photosensors FX may be grouped into the plurality of reference pixel units RPU. For example, each reference pixel unit RPU may include two photosensors, that is, a first photosensor and a second photosensor. However, the number of photosensors included in each reference pixel unit RPU is not limited thereto. In addition, each reference pixel unit RPU may include one photosensor or three or more photosensors.

The first photosensor includes a first light sensing element OPD1, and the second photosensor includes a second light sensing element OPD2. Each of the first and second light sensing elements OPD1 and OPD2 may be disposed between the red light-emitting element ED_R and the blue light-emitting element ED_B in the second direction DR2. Each of the first and second light sensing elements OPD1 and OPD2 may be disposed adjacent to the first green light-emitting element ED_G1 or the second green light-emitting element ED_G2 in the first direction DR1. For example, the first green light-emitting element ED_G1 and the first light sensing element OPD1 may be alternately arranged in the first direction DR1, and the second green light-emitting element ED_G2 and the second light sensing element OPD2 may be alternately arranged in the first direction DR1. For example, the first light sensing element OPD1 is disposed between two neighboring first green light-emitting elements ED_G1 in the first direction DR1. The second light sensing element OPD2 is disposed between two neighboring second green light-emitting elements ED_G2 in the first direction DR1.

The first and second light sensing elements OPD1 and OPD2 may have the same size and the same shape as each other. Each of the first and second light sensing elements OPD1 and OPD2 may be smaller in size than each of the red and blue light-emitting elements ED_R and ED_B. For example, each of the first and second light sensing elements OPD1 and OPD2 may be identical in size to the first and second green light-emitting elements ED_G1 and ED_G2 or may be similar in size to the first and second green light-emitting elements ED_G1 and ED_G2. However, the size of each of the first and second light sensing elements OPD1 and OPD2 is not limited thereto, and may be variously modified and applied. Each of the first and second light sensing elements OPD1 and OPD2 may be different in shape from the red and blue light-emitting elements ED_R and ED_B. For example, each of the first and second light sensing elements OPD1 and OPD2 may be in the shape of a rectangle. Each of the first and second light sensing elements OPD1 and OPD2 may be in the shape of a rectangle where a length in the first direction DR1 is longer than a length in the second direction DR2. In addition, each of the first and second light sensing elements OPD1 and OPD2 may be in the shape of a square where a length in the first direction DR1 is identical to a length in the second direction DR2.

Figure 5:
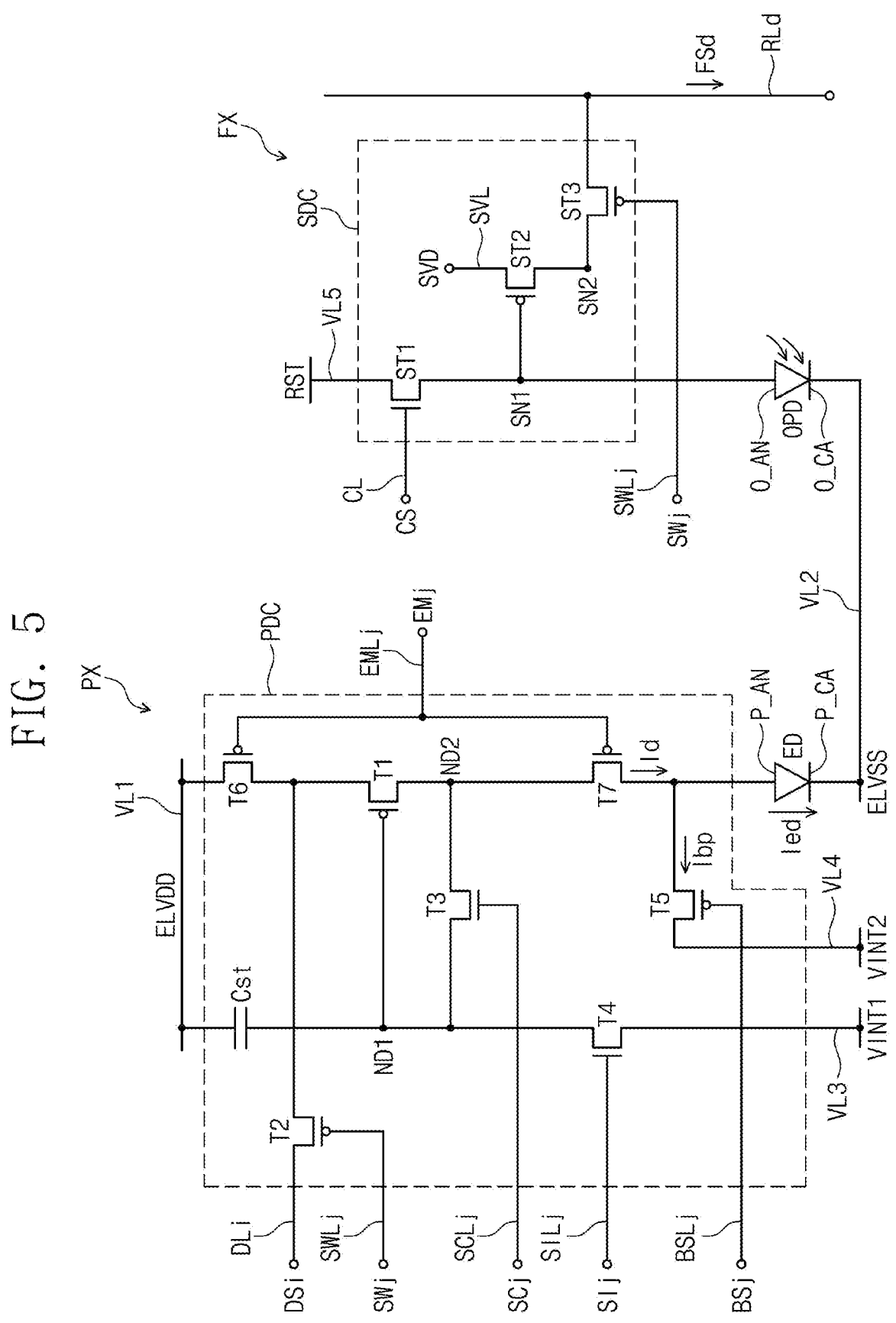
FIG. 5 is a circuit diagram illustrating a pixel and a photosensor of a display panel according to an embodiment of the present invention.

FIG. 5 is a circuit diagram illustrating a pixel and a photosensor of a display panel according to an embodiment of the present invention.

A pixel equivalent circuit diagram of one pixel PX of the plurality of pixels PX illustrated in FIG. 3 is illustrated in FIG. 5 as an example. Below, a circuit structure of the one pixel PX will be described. The plurality of pixels PX have the same structure as each other, and thus, additional description associated with the remaining pixels PX will be omitted to avoid redundancy.

In addition, an equivalent circuit diagram of one photosensor FX of the plurality of photosensors FX illustrated in FIG. 3 is illustrated in FIG. 5 as an example. A circuit structure of the one photosensor FX will be described. The plurality of photosensors FX have the same structure as each other, and thus, additional description associated with the remaining photosensors FX will be omitted to avoid redundancy.

Referring to FIG. 5, the pixel PX is connected with the i-th data line DLi of the data lines DL1 to DLm, the j-th initialization scan line SILj of the initialization scan lines SIL1 to SILn, the j-th compensation scan line SCLj of the compensation scan lines SCL1 to SCLn, the j-th write scan line SWLj of the write scan lines SWL1 to SWLn, the j-th black scan line BSLj of the black scan lines BSL1 to BSLn, and the j-th emission control line EMLj of the emission control lines EML1 to EMLn.

The pixel PX includes the light-emitting element ED and the pixel driving circuit PDC. The light-emitting element ED may be a light-emitting diode. For example, the light-emitting element ED may include an organic light-emitting diode including an organic light-emitting layer. The pixel driving circuit PDC is electrically connected with the light-emitting element ED and controls an operation of the light-emitting element ED.

The pixel driving circuit PDC includes first to seventh transistors T1, T2, T3, T4, T5, T6, and T7 and one capacitor Cst. At least one of the first to seventh transistors T1, T2, T3, T4, T5, T6, and T7 may be a transistor having a low-temperature polycrystalline silicon (LTPS) semiconductor layer. At least one of the first to seventh transistors T1, T2, T3, T4 T5, T6, and T7 may be a transistor having an oxide semiconductor layer. Some of the first to seventh transistors T1 to T7 may be P-type transistors, and the remaining transistors may be N-type transistors. For example, the first, second, fifth, sixth, and seventh transistors T1, T2, T5, T6, and T7 are PMOS transistors, and the third and fourth transistors T3 and T4 may be NMOS transistors. For example, the third and fourth transistors T3 and T4 may be oxide semiconductor transistors, and the first, second, fifth, sixth, and seventh transistors T1, T2, T5, T6, and T7 may be LTPS semiconductor transistors.

A configuration of the pixel driving circuit PDC according to an embodiment of the present invention is not limited to the embodiment illustrated in FIG. 5. The pixel driving circuit PDC illustrated in FIG. 5 is only an example, and the configuration of the pixel driving circuit PDC may be modified and implemented. For example, all the first to seventh transistors T1 to T7 may be P-type transistors or N-type transistors.

The j-th initialization scan line SILj, the j-th compensation scan line SCLj, the j-th write scan line SWLj, the j-th black scan line BSLj, and the j-th emission control line EMLj may transfer a j-th initialization scan signal SIj, a j-th compensation scan signal SCj, a j-th write scan signal SWj, a j-th black scan signal BSj, and a j-th emission control signal EMj to the pixel PX, respectively. The i-th data line DLi transfers an i-th data signal DSi to the pixel PX. The i-th data signal DSi may have a voltage level corresponding to the image signal RGB (refer to FIG. 3) that is input to the display device DD (refer to FIG. 3).

First and second driving voltage lines VL1 and VL2 may respectively transfer the first and second driving voltages ELVDD and ELVSS to the pixel PX. In addition, first and second initialization voltage lines VL3 and VL4 may respectively transfer the first and second initialization voltages VINT1 and VINT2 to the pixel PX.

The first transistor T1 is connected between the first driving voltage line VL1, which receives the first driving voltage ELVDD, and the light-emitting element ED. The first transistor T1 includes a first electrode connected with the first driving voltage line VL1 through the sixth transistor T6, a second electrode connected with a pixel anode electrode P_AN of the light-emitting device ED through the seventh transistor T7, and a third electrode connected with a first end (e.g., a first end connected with a first node ND1) of the capacitor Cst. The first transistor T1 may receive the i-th data signal DSi transferred through the i-th data line DLi depending on a switching operation of the second transistor T2 and may then supply a driving current Id to the light-emitting element ED.

The second transistor T2 is connected between the i-th data line DLi and the first electrode of the first transistor T1. The second transistor T2 includes a first electrode connected with the i-th data line DLi, a second electrode connected with the first electrode of the first transistor T1, and a third electrode connected with the j-th write scan line SWLj. The second transistor T2 may be turned on depending on the j-th write scan signal SWj transferred through the j-th write scan line SWLj and may then transfer the i-th data signal DSi transferred through the i-th data line DLi to the first electrode of the first transistor T1.

The third transistor T3 is connected between the second electrode of the first transistor T1 and the first node ND1. The third transistor T3 includes a first electrode connected with the third electrode of the first transistor T1, a second electrode connected with the second electrode of the first transistor T1, and a third electrode connected with the j-th compensation scan line SCLj. The third transistor T3 may be turned on depending on the j-th compensation scan signal SCj transferred through the j-th compensation scan line SCLj and may then connect the third electrode and the second electrode of the first transistor T1 to each other. In this case, the first transistor T1 may be diode-connected.

The fourth transistor T4 is connected between the first initialization voltage line VL3 to which the first initialization voltage VINT1 is applied and the first node ND1. The fourth transistor T4 includes a first electrode connected with the first initialization voltage line VL3, a second electrode connected with the first node ND1, and a third electrode connected with the j-th initialization scan line SILj. The fourth transistor T4 is turned on depending on the j-th initialization scan signal SIj transferred through the j-th initialization scan line SILj. When the fourth transistor T4 is turned on, the fourth transistor T4 transfers the first initialization voltage VINT1 to the first node ND1 such that a potential of the third electrode of the first transistor T1 (i.e., a potential of the first node ND1) is initialized.

The sixth transistor T6 includes a first electrode connected with the first driving voltage line VL1, a second electrode connected with the first electrode of the first transistor T1, and a third electrode connected with the j-th emission control line EMLj.

The seventh transistor T7 includes a first electrode connected with the second electrode of the first transistor T1, a second electrode connected with the pixel anode electrode P_AN of the light-emitting element ED, and a third electrode connected with the j-th emission control line EMLj.

The sixth and seventh transistors T6 and T7 are simultaneously turned on depending on the j-th emission control signal EMj transferred through the j-th emission control line EMLj. The first driving voltage ELVDD applied through the sixth transistor T6, when turned on, may be compensated for through the diode-connected first transistor T1 and may then be transferred to the light-emitting element ED.

The fifth transistor T5 includes a first electrode connected with the second initialization voltage line VIA through which the second initialization voltage VINT2 is transferred, a second electrode connected with the second electrode of the seventh transistor T7, and a third electrode connected with the j-th black scan line BSLj. A voltage level of the second initialization voltage VINT2 may be lower than or equal to that of the first initialization voltage VINT1.

As described above, the first end of the capacitor Cst is connected with the third electrode of the first transistor T1, and a second end of the capacitor Cst is connected with the first driving voltage line VL1.

A pixel cathode electrode P_CA of the light-emitting element ED may be connected with the second driving voltage line VL2 transferring the second driving voltage ELVSS. A voltage level of the second driving voltage ELVSS may be lower than a voltage level of the first driving voltage ELVDD. For example, the voltage level of the second driving voltage ELVSS may be lower than the voltage levels of each of the first and second initialization voltages VINT1 and VINT2.

For example, in one driving frame of the display panel DP (refer to FIG. 3), the j-th emission control signal EMj includes an emission period and a non-emission period. The j-th emission control signal EMj has a high level during the non-emission period. During the non-emission period, the j-th initialization scan signal SIj is activated. During an active period (hereinafter referred to as a "first active period") of the j-th initialization scan signal SIj, when the j-th initialization scan signal SIj of the high level is provided through the j-th initialization scan line SILj, the fourth transistor T4 is turned on in response to the j-th initialization scan signal SIj of the high level. When the fourth transistor T4 is turned on, the first initialization voltage VINT1 is transferred to the third electrode of the first transistor T1 through the fourth transistor T4, and the first node ND1 is initialized to the first initialization voltage VINT1. Accordingly, the first active period may be defined as an initialization period of the pixel PX.

Next, the j-th compensation scan signal SCj is activated; the third transistor T3 is turned on when the j-th compensation scan signal SCj of the high level is supplied through the j-th compensation scan line SCLj during an active period (hereinafter referred to as a "second active period") of the j-th compensation scan signal SCj. When the third transistor T3 is turned on, the first transistor T1 is diode-connected by the third transistor T3, so as to be forward-biased. The first active period does not overlap the second active period.

The j-th write scan signal SWj is activated in the second active period. The j-th write scan signal SWj has a low level during an active period (hereinafter referred to as a "fourth active period"). During the fourth active period, the second transistor T2 is turned on by the j-th write scan signal SWj of the low level. In this case, a compensation voltage "DSi–Vth" is applied to the third electrode of the first transistor T1. Herein, the compensation voltage "DSi–Vth" may correspond to a result of subtracting a threshold voltage Vth of the first transistor T1 from a voltage of the i-th data signal DSi supplied from the i-th data line DLi. For example, a potential of the third electrode of the first transistor T1 may be the compensation voltage "DSi–Vth". The fourth active period overlaps the second active period. The duration of the second active period may be greater than the duration of the fourth active period.

The first driving voltage ELVDD and the compensation voltage "DSi–Vth" may be respectively applied to opposite ends (i.e., the second and first ends) of the capacitor Cst, and charges corresponding to a voltage difference between the opposite ends of the capacitor Cst may be stored in the capacitor Cst. Herein, a high-level period of the j-th compensation scan signal SCj may be referred to as a "compensation period" of the pixel PX.

In addition, the j-th black scan signal BSj is activated in the second active period of the j-th compensation scan signal SCj. The j-th black scan signal BSj has the low level during an active period (hereinafter referred to as a "third active period"). During the third active period, the fifth transistor T5 is turned on by the j-th black scan signal BSj of the low level supplied through the j-th black scan line BSLj. A portion of the driving current Id may be drained through the fifth transistor T5 as a bypass current Ibp. The third active period may overlap the second active period. The duration of the second active period may be greater than the duration of the third active period. The third active period may precede the fourth active period and might not overlap the fourth active period.

Assuming the case where the pixel PX displays a black image, even though a minimum driving current of the first transistor T1 flows as the driving current Id, the light-emitting element ED may emit a light. For example, the pixel PX fails to normally display a black image. Accordingly, the fifth transistor T5 according to an embodiment of the present invention may drain (or disperse) a part of the minimum driving current of the first transistor T1 to a current path, which is different from a current path to the light-emitting element ED, as the bypass current Ibp. Herein, the minimum driving current of the first transistor T1 means a leakage current flowing to the first transistor T1 under the condition that a gate-source voltage Vgs of the first transistor T1 is smaller than the threshold voltage Vth, that is, the first transistor T1 is turned off. As the minimum driving current (e.g., a current of 10 pA or less) flowing to the first transistor T1 is transferred to the light-emitting element ED under the condition that the first transistor T1 is turned off, an image of a black gray scale is displayed. In the case where the pixel PX displays the black image, the bypass current Ibp has a relatively large influence on the minimum driving current; in contrast, in the case where the pixel PX displays an image such as a normal image or a white image, there is a little influence of the bypass current Ibp on the driving current Id. Accordingly, assuming the case where the pixel PX displays a black image, a current (i.e., the light-emitting current Ied) that corresponds to a result of subtracting the bypass current Ibp flowing through the fifth transistor T5 from the driving current Id is provided to the light-emitting element ED, and thus, a black image may be clearly displayed. According to the above description, the pixel PX may implement an accurate black gray scale image by using the fifth transistor T5, and thus, a contrast ratio may be improved.

Next, the j-th emission control signal EMj that is supplied from the j-th emission control line EMLj transitions from the high level to the low level. The sixth and seventh transistors T6 and T7 are turned on by the emission control signal EMj of the low level. In this case, the driving current Id is generated depending on a difference between the voltage of the third electrode of the first transistor T1 and the first driving voltage ELVDD. The driving current Id thus generated is supplied to the light-emitting element ED through the seventh transistor T7, and thus, the current Ied flows through the light-emitting element ED.

Referring again to FIG. 5, the photosensor FX is connected with the d-th sensing line RLd of the sensing lines RL1 to RLh, the j-th write scan line SWLj, and a sensing control line CL.

The photosensor FX includes the light sensing element OPD and the sensing driving circuit SDC. The light sensing element OPD may be a photodiode. For example, the light sensing element OPD may be an organic photodiode including an organic material as a photoelectric conversion layer. An anode electrode O_AN (hereinafter referred to as a "sensing anode electrode") of the light sensing element OPD may be connected with a first sensing node SN1. A cathode electrode O_CA (hereinafter referred to as a "sensing cathode electrode") of the light sensing element OPD may be connected with the second driving voltage line VL2 transferring the second driving voltage ELVSS. The sensing driving circuit SDC is electrically connected with the light sensing element OPD and controls an operation of the light sensing element OPD.

The sensing driving circuit SDC includes three transistors ST1 to ST3. The three transistors ST1 to ST3 may be a reset transistor ST1, an amplification transistor ST2, and an output transistor ST3, respectively. At least one of the reset transistor ST1, the amplification transistor ST2, and/or the output transistor ST3 may be an oxide semiconductor transistor. For example, the reset transistor ST1 may be an oxide semiconductor transistor, and the amplification transistor ST2 and the output transistor ST3 may be LTPS transistors. However, the present invention is not limited thereto. For example, at least the reset transistor ST1 and the output transistor ST3 may be oxide semiconductor transistors, and the amplification transistor ST2 may be an LTPS semiconductor transistor.

In addition, some of the reset transistor ST1, the amplification transistor ST2, and the output transistor ST3 may be P-type transistors, and the other(s) thereof may be an N-type transistor. For example, the amplification transistor ST2 and the output transistor ST3 may be P-type transistors, and the reset transistor ST1 may be an N-type transistor. However, the present invention is not limited thereto. For example, all the transistors ST1, ST2, and ST3 may be N-type transistors or P-type transistors.

Some (e.g., the reset transistor ST1) of the reset transistor ST1, the amplification transistor ST2, and the output transistor ST3 may be implemented with a transistor whose type is identical to the type of the third and fourth transistors T3 and T4 of the pixel PX. The amplification transistor ST2 and the output transistor ST3 may be implemented as a transistor whose type is identical to the type of the first, second, fifth, sixth, and seventh transistors T1, T2, T5, T6, and T7 of the pixel PX.

The circuit configuration of the sensing driving circuit SDC according to an embodiment of the present invention is not limited to an example illustrated in FIG. 5. The sensing driving circuit SDC illustrated in FIG. 5 is only an example, and the configuration of the sensing driving circuit SDC may be modified and implemented.

The reset transistor ST1 includes a first electrode connected with a reset reception line VL5 receiving a reset voltage RST, a second electrode connected with the first sensing node SN1, and a third electrode connected with the sensing control line CL receiving a sensing control signal CS. The reset transistor ST1 may reset a potential of the first sensing node SN1 to the reset voltage RST in response to the sensing control signal CS. For example, the sensing control signal CS may be the j-th compensation scan signal SCj supplied from the j-th compensation scan line SCLj. In this case, the sensing control line CL may be electrically connected with the j-th compensation scan line SCLj. For example, the reset transistor ST1 may receive the j-th compensation scan signal SCj supplied from the j-th compensation scan line SCLj as the sensing control signal CS. However, the present invention is not limited thereto. The sensing control line CL may be a line electrically insulated from the scan lines SWLj, SCLj, SILj, and SBLj. In addition, the sensing control signal CS may be a signal independent of the j-th compensation scan signal SCj. A time at which the sensing control signal CS is activated may be different from a time at which the j-th compensation scan signal SCj is activated.

For example, the reset voltage RST may be a DC voltage that is maintained at a voltage level lower than that of the second driving voltage ELVSS. However, the present invention is not limited thereto. The reset voltage RST may have a voltage level lower than that of the second driving voltage ELVSS during at least an active period of the sensing control signal CS. In an embodiment of the present invention, the voltage generation block VGB (refer to FIG. 3) may generate the reset voltage RST as a voltage that is identical to one of the first and second initialization voltages VINT1 and VINT2.

In an embodiment of the present invention, the reset transistor STJ may include a plurality of sub-reset transistors that are connected in series. For example, the reset transistor ST1 may include two sub-reset transistors (hereinafter referred to as "first and second sub-reset transistors"). In this case, a third electrode of the first sub-reset transistor and a third electrode of the second sub-reset transistor are connected with the sensing control line CL. In addition, a second electrode of the first sub-reset transistor and a first electrode of the second sub-reset transistor may be electrically connected to each other. In addition, the reset voltage RST may be applied to a first electrode of the first sub-reset transistor, and a second electrode of the second sub-reset transistor may be electrically connected with the first sensing node SN1. However, the number of sub-reset transistors is not limited thereto and may be variously changed or modified.

The amplification transistor ST2 includes a first electrode connected with a sensing driving line SVL receiving a sensing driving voltage SVD, a second electrode connected with a second sensing node SN2, and a third electrode connected with the first sensing node SN1. The amplification transistor ST2 may be turned on depending on a potential of the first sensing node SN1 and may apply the sensing driving voltage SVD to the second sensing node SN2. For example, the sensing driving voltage SVD may correspond to one of the first driving voltage ELVDD and the first and second initialization voltages VINT1 and VINT2. When the sensing driving voltage SVD corresponds to the first driving voltage ELVDD, the sensing driving line SVL may be electrically connected with the first driving voltage line VL1. When the sensing driving voltage SVD corresponds to the first initialization voltage VINT1, the sensing driving line SVL may be electrically connected with the first initialization voltage line VL3. When the sensing driving voltage SVD corresponds to the second initialization voltage VINT2, the sensing driving line SVL may be electrically connected with the second initialization voltage line VIA.

The output transistor ST3 includes a first electrode connected with the second sensing node SN2, a second electrode connected with the d-th sensing line RLd, and a third electrode receiving an output control signal. The output transistor ST3 may transfer a d-th sensing signal FSd to the d-th sensing line RLd in response to the output control signal. The output control signal may be the j-th write scan signal SWj that is supplied through the j-th write scan line SWLj. For example, the output transistor ST3 may receive the j-th write scan signal SWj supplied from the j-th write scan line SWLj as the output control signal.

The light sensing element OPD of the photosensor FX may be exposed to a light emitted from the light-emitting element ED. For example, the light sensing element OPD may generate photo charges corresponding to a received light, and the generated photo charges may be accumulated at the first sensing node SN1. For example, in the case where the light-emitting element ED emits a light when the hand of the user US (refer to FIG. 1) touches the display surface IS (refer to FIG. 1) of the display device DD (refer to FIG. 1), the light sensing element OPD receives at least a portion, which is reflected by the hand of the user US, from among the light emitted from the light-emitting element ED and generates photo charges corresponding to the reflected light thus received.

The d-th sensing signal FSd, which is transferred from the sensing driving line SVL to the d-th sensing line RLd through the amplification transistor ST2 and the output transistor ST3 when the output transistor ST3 is turned on, is determined by the amount of charges of the first sensing node SN1. For example, in the case where the output transistor ST3 is a P-type transistor, as the amount of photo charges that are generated by the light sensing element OPD and are integrated at the first sensing node SN1 increases, the magnitude of the d-th sensing signal FSd may decrease.

Figure 6:
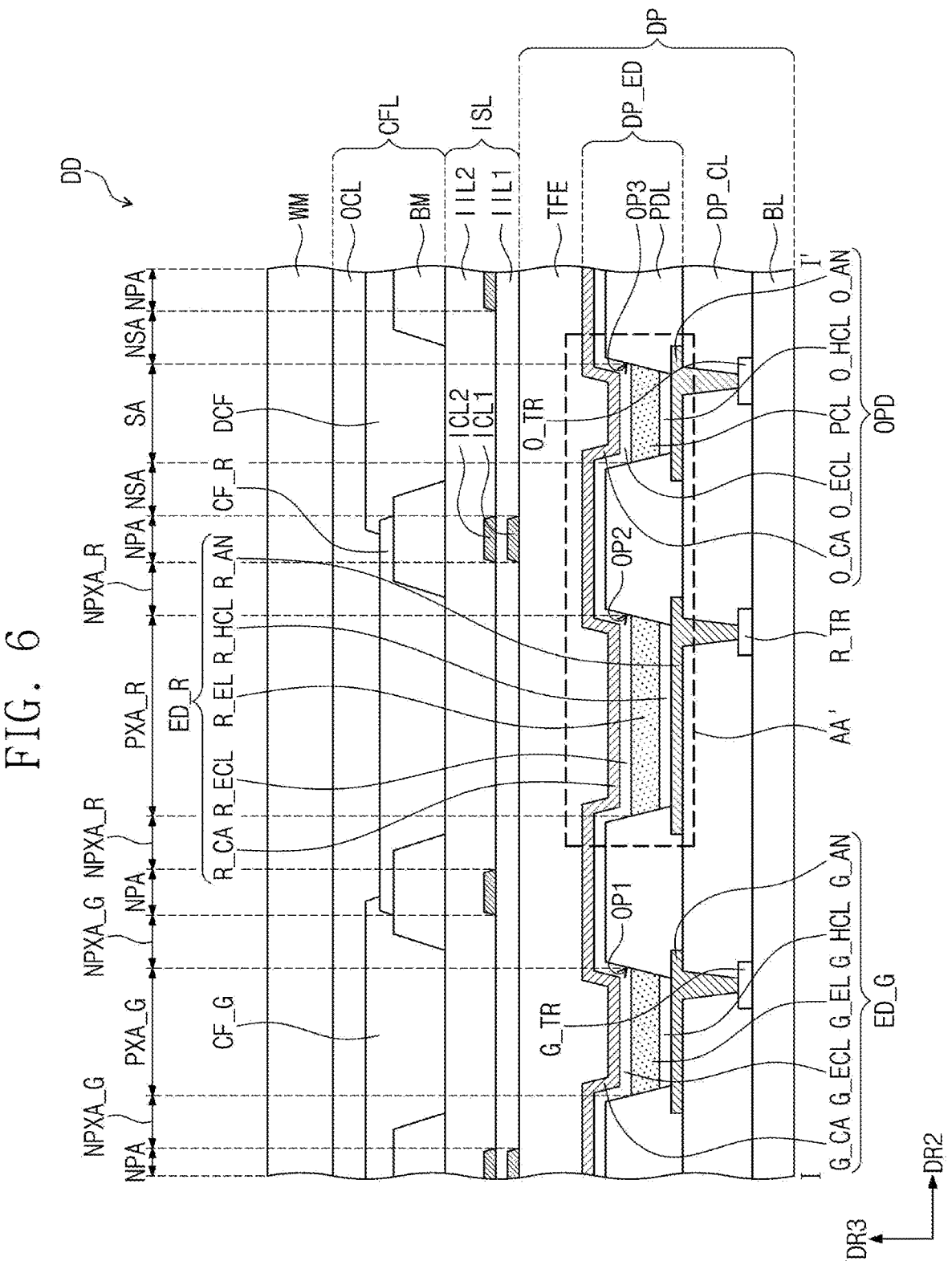
FIG. 6 is a cross-sectional view of a display device taken along line I-I' illustrated in FIG. 4.

FIG. 6 is a cross-sectional view of a display device taken along line I-I' illustrated in FIG. 4.

Referring to FIG. 6, the display panel DP may include the base layer BL, the circuit layer DP_CL disposed on the base layer BL, the element layer DP_ED, and the encapsulation layer TFE.

The base layer BL may include a synthetic resin layer. The synthetic resin layer may include, for example, a thermosetting resin material. For example, the synthetic resin layer may be a polyimide-based resin layer, and a material thereof is not specifically limited. The synthetic resin layer may include at least one of, for example, acrylic resin, methacrylic resin, polyisoprene, vinyl resin, epoxy resin, urethane resin, cellulose resin, siloxane resin, polyamide resin, and/or perylene resin. In addition, the base layer BL may include a glass substrate, a metal substrate, an organic/inorganic composite substrate, or the like.

The circuit layer DP_CL is disposed on the base layer BL. For example, the circuit layer DP_CL includes the pixel driving circuit PDC and the sensing driving circuit SDC illustrated in FIG. 5. For example, some components of the pixel driving circuit PDC included in the circuit layer DP_CL, that is, a green pixel transistor G_TR and a red pixel transistor R_TR are illustrated in FIG. 6. For example, the green pixel transistor G_TR is electrically connected with the green light-emitting element ED_G included in the element layer DP_ED. The red pixel transistor R_TR is electrically connected with the red light-emitting element ED_R included in the element layer DP_ED. For example, the green pixel transistor G_TR may be a transistor corresponding to the seventh transistor T7 (refer to FIG. 5) of the pixel driving circuit PDC included in the green pixel. The red pixel transistor R_TR may be the seventh transistor T7 of the pixel driving circuit PDC included in the red pixel. However, the present invention is not limited thereto. For example, transistors corresponding to the green pixel transistor G_TR and the red pixel transistor R_TR from among the transistors of the pixel driving circuit PDC may change depending on circuit configurations of the green pixel and the red pixel.

In addition, as an example, some components of the sensing driving circuit SDC included in the circuit layer DP_CL, that is, a sensor transistor O_TR is illustrated in FIG. 6. For example, the sensor transistor O_TR may be a transistor corresponding to the reset transistor ST1 of the sensing driving circuit SDC. However, the present invention is not limited thereto. For example, a transistor corresponding to the sensor transistor O_TR from among the transistors of the sensing driving circuit SDC may change depending on a circuit configuration of a photosensor.

The element layer DP_ED is disposed on the circuit layer DP_CL. For example, the element layer DP_ED includes the light-emitting element ED (refer to FIG. 5), the light sensing element OPD, and an element defining layer PDL. For example, the green light-emitting element ED_G and the red light-emitting element ED_R are light-emitting elements illustrated in FIG. 6. Because the green light-emitting element ED_G, the red light-emitting element ED_R, and the blue light-emitting element have the same pixel structure, the green light-emitting element ED_G and the red light-emitting element ED_R will be described below, and additional description associated with the blue light-emitting element will be omitted to avoid redundancy.

For example, the light-emitting element ED includes the pixel anode electrode P_AN (refer to FIG. 5), a pixel hole auxiliary layer, an emissive layer, a pixel electron auxiliary layer, and the pixel cathode electrode P_CA. The light-emitting element ED includes the green light-emitting element ED_G and the red light-emitting element ED_R.

The green light-emitting element ED_G includes a green anode electrode G_AN, a green hole auxiliary layer G_HCL, a green emissive layer G_EL, a green electron auxiliary layer G_ECL, and a green cathode electrode G_CA. The red light-emitting element ED_R includes a red anode electrode R_AN, a red hole auxiliary layer R_HCL, a red emissive layer R_EL, a red electron auxiliary layer R_ECL, and a red cathode electrode R_CA.

For example, the light sensing element OPD includes the sensing anode electrode O_AN, a sensing hole auxiliary layer O_HCL, a photoelectric conversion layer PCL, a sensing electron auxiliary layer O_ECL, and the sensing cathode electrode O_CA.

The green anode electrode G_AN, the red anode electrode R_AN, and the sensing anode electrode O_AN are disposed on the circuit layer DP_CL. The green anode electrode G_AN may be connected with the green pixel transistor G_TR through a contact hole penetrating an insulating layer included in the circuit layer DP_CL. However, the present invention is not limited thereto. For example, the green anode electrode G_AN may be connected with a connecting electrode through the contact hole penetrating the insulating layer included in the circuit layer DP_CL. The red anode electrode R_AN may be connected with the red pixel transistor R_TR through a contact hole penetrating the insulating layer included in the circuit layer DP_CL. However, the present invention is not limited thereto. For example, the red anode electrode R_AN may be connected with a connecting electrode that is electrically connected with the red pixel transistor R_TR through the contact hole penetrating the insulating layer included in the circuit layer DP_CL. The sensing anode electrode O_AN may be connected with the sensor transistor O_TR through a contact hole penetrating the insulating layer included in the circuit layer DP_CL. However, the present invention is not limited thereto. For example, the sensing anode electrode O_AN may be connected with a connecting electrode that is electrically connected with the sensor transistor O_TR through the contact hole penetrating the insulating layer included in the circuit layer DP_CL.

The element defining layer PDL is disposed on the circuit layer DP_CL, the green anode electrode G_AN, the red anode electrode R_AN, and the sensing anode electrode O_AN. A first opening OP1 of the element defining layer PDL exposes at least a portion of the green anode electrode G_AN. A second opening OP2 of the element defining layer PDL exposes at least a portion of the red anode electrode R_AN. A third opening OP3 of the element defining layer PDL exposes at least a portion of the sensing anode electrode O_AN.

For example, the plurality of pixels PX (refer to FIG. 3) may be arranged on a plane of the display panel DP (refer to FIG. 3) depending on a specific rule. An area in which the plurality of pixels PX are arranged may be defined as a pixel area, and one pixel area may include an emission area PXA and a non-emission area NPXA adjacent to the emission area PXA. The non-emission area NPXA at least partially surrounds the emission area PXA.

For example, the emission area PXA may include a green emission area PXA_G where a green pixel is disposed, a red emission area PXA_R where a red pixel is disposed, and a blue emission area where a blue pixel is disposed. For example, the green emission area PXA_G and the red emission area PXA_R of the emission area PXA are illustrated in FIG. 6. The first opening OP1 of the element defining layer PDL may define the green emission area PXA_G. For example, the second opening OP2 of the element defining layer PDL may define the red emission area PXA_R.

For example, the non-emission area NPXA includes a green non-emission area NPXA_G, which is adjacent to the green emission area PXA_G, a red non-emission area NPXA_R, which is adjacent to the red emission area PXA_R, and a blue non-emission area, which is adjacent to the blue emission area. The green non-emission area NPXA_G at least partially surrounds the green emission area PXA_G. The red non-emission area NPXA_R at least partially surrounds the red emission area PXA_R. A non-pixel area NPA may be defined between the green, red, and blue non-emission areas NPXA_G and NPXA_R.

For example, the plurality of photosensors FX (refer to FIG. 3) may be arranged on a plane of the display panel DP (refer to FIG. 3) depending on a specific rule. An area in which the plurality of photosensors FX are arranged may be defined as a photosensor area, and one photosensor area may include a sensing area SA and a non-sensing area NSA adjacent to the sensing area SA. For example, the third opening OP3 of the element defining layer PDL may define the sensing area SA. The non-sensing area NSA may at least partially surround the sensing area SA. For example, the non-pixel area NPA may be defined between the non-sensing area NSA and the green, red, and blue non-emission areas NPXA_G and NPXA_R.

For example, the element defining layer PDL may further include a black material. The element defining layer PDL may further include a black organic dye/pigment such as carbon black or aniline black. The element defining layer PDL may be formed by mixing a blue organic material and a black organic material. The element defining layer PDL may further include a liquid-repellent organic material.

The pixel hole auxiliary layer is disposed on the pixel anode electrode P_AN. The sensing hole auxiliary layer O_HCL is disposed on the sensing anode electrode O_AN. The pixel hole auxiliary layer includes the green hole auxiliary layer G_HCL and the red hole auxiliary layer R_HCL.

For example, the green hole auxiliary layer G_HCL is disposed on the green anode electrode G_AN. The green hole auxiliary layer G_HCL may be disposed only in an area corresponding to the first opening OP1. The green hole auxiliary layer G_HCL is not disposed in the green non-emission area NPXA_G and the non-pixel area NPA.

The red hole auxiliary layer R_HCL is disposed on the red anode electrode R_AN. The red hole auxiliary layer R_HCL may be disposed only in an area corresponding to the second opening OP2. The red hole auxiliary layer R_HCL is not disposed in the red non-emission area NPXA_R and the non-pixel area NPA.

The sensing hole auxiliary layer O_HCL is disposed on the sensing anode electrode O_AN. The sensing hole auxiliary layer O_HCL may be disposed only in an area corresponding to the third opening OP3. The sensing hole auxiliary layer O_HCL is not disposed in the non-sensing area NSA and the non-pixel area NPA.

For example, the green hole auxiliary layer G_HCL, the red hole auxiliary layer R_HCL, and the sensing hole auxiliary layer O_HCL may be electrically insulated from each other.

The emissive layer is disposed on the pixel hole auxiliary layer. The emissive layer may be independently formed for each of the plurality of pixels PX. The emissive layer includes the green emissive layer G_EL and the red emissive layer R_EL. For example, the green emissive layer G_EL is disposed on the green hole auxiliary layer G_HCL. The green emissive layer G_EL may be disposed only in an area corresponding to the first opening OP1. The red emissive layer R_EL is disposed on the red hole auxiliary layer R_HCL. The red emissive layer R_EL may be disposed only in an area corresponding to the second opening OP2. In this embodiment, the patterned green emissive layer G_EL and the patterned red emissive layer R_EL are illustrated as an example, but the present invention is not limited thereto. A common emissive layer may be disposed in common in the plurality of pixels PX. In this case, the common emissive layer may generate a white light or a blue light.

The pixel electron auxiliary layer is disposed on the emissive layer. The pixel electron auxiliary layer includes the green electron auxiliary layer G_ECL and the red electron auxiliary layer R_ECL. The green electron auxiliary layer G_ECL and the red electron auxiliary layer R_ECL may be disposed in common in the plurality of pixels PX. For example, the green electron auxiliary layer G_ECL may be disposed in the green emission area PXA_G, the green non-emission area NPXA_G, and the non-pixel area NPA. The red electron auxiliary layer R_ECL may be disposed in the red emission area PXA_R, the red non-emission area NPXA_R, and the non-pixel area NPA. For example, the green electron auxiliary layer G_ECL and the red electron auxiliary layer R_ECL may be electrically connected with each other.

The sensing electron auxiliary layer O_ECL is disposed on the photoelectric conversion layer PCL. The sensing electron auxiliary layer O_ECL may be disposed in common in the plurality of photosensors FX. For example, the sensing electron auxiliary layer O_ECL may be disposed in the sensing area SA and the non-sensing area NSA. For example, the green electron auxiliary layer G_ECL, the red electron auxiliary layer R_ECL, and the sensing electron auxiliary layer O_ECL may be electrically connected with each other. For example, the green electron auxiliary layer G_ECL, the red electron auxiliary layer R_ECL, and the sensing electron auxiliary layer O_ECL may be formed in common.

The pixel cathode electrode P_CA (refer to FIG. 5) is disposed on the pixel electron auxiliary layer. The pixel cathode electrode P_CA includes the green cathode electrode G_CA and the red cathode electrode R_CA. The green cathode electrode G_CA and the red cathode electrode R_CA may be disposed in common in the plurality of pixels PX. For example, the green cathode electrode G_CA may be disposed in the green emission area PXA_G, the green non-emission area NPXA_G, and the non-pixel area NPA. The red cathode electrode R_CA may be disposed in the red emission area PXA_R, the red non-emission area NPXA_R, and the non-pixel area NPA. For example, the green cathode electrode G_CA and the red cathode electrode R_CA may be electrically connected with each other.

The sensing cathode electrode O_CA is disposed on sensing electron auxiliary layer O_ECL. The sensing cathode electrode O_CA may be disposed in common in the plurality of photosensors FX. For example, the sensing cathode electrode O_CA may be disposed in the sensing area SA and the non-sensing area NSA. For example, the green cathode electrode G_CA, the red cathode electrode R_CA, and the sensing cathode electrode O_CA may be electrically connected with each other. For example, the green cathode electrode G_CA, the red cathode electrode R_CA, and the sensing cathode electrode O_CA may be formed in common.

The encapsulation layer TFE is disposed on the green cathode electrode G_CA, the red cathode electrode R_CA, and the sensing cathode electrode O_CA. The encapsulation layer TFE may cover the plurality of pixels PX and the plurality of photosensors FX. In an embodiment of the present invention, the encapsulation layer TFE directly covers the green cathode electrode G_CA, the red cathode electrode R_CA, and the sensing cathode electrode O_CA. The encapsulation layer TFE includes at least one inorganic layer or at least one organic layer. In an embodiment of the present invention, the encapsulation layer TFE may include two inorganic layers and an organic layer interposed therebetween. In an embodiment of the present invention, a thin film encapsulation layer may include a plurality of inorganic layers (hereinafter referred to as "encapsulation inorganic layers") and a plurality of organic layers (hereinafter referred to as "encapsulation organic layers") that are alternately stacked. The encapsulation inorganic layer may protect the green and red light-emitting elements ED_G and ED_R and the light sensing element OPD from moisture/oxygen, and the encapsulation organic layer may protect the green and red light-emitting elements ED_G and ED_R and the light sensing element OPD from foreign substances such as dust particles. The encapsulation inorganic layer may include, for example, a silicon nitride layer, a silicon oxynitride layer, a silicon oxide layer, a titanium oxide layer, an aluminum oxide layer, or the like but the present invention is not specially limited thereto. The encapsulation organic layer may include, for example, an acryl-based organic layer and is not specifically limited thereto. In an embodiment of the present invention, the stacked structure of the green light-emitting element ED_G, the red light-emitting element ED_R, and the light sensing element OPD may have a structure in which the structure illustrated in FIG. 6 is vertically inverted.

The input sensing layer ISL may be disposed on the encapsulation layer TFE. For example, the input sensing layer ISL may be directly disposed on the encapsulation layer TFE. The input sensing layer ISL may include a first conductive layer ICL1, a first insulating layer IIL1, a second conductive layer ICL2, and a second insulating layer IIL2. The first conductive layer ICL1 may be disposed on the encapsulation layer TFE. A structure in which the first conductive layer ICL1 is directly disposed on the encapsulation layer TFE is illustrated in FIG. 6, but the present invention is not limited thereto. The input sensing layer ISL may further include a base insulating layer disposed between the first conductive layer ICL1 and the encapsulation layer TFE. In this case, the encapsulation layer TFE may be covered by the base insulating layer, and the first conductive layer ICL1 may be disposed on the base insulating layer. For example, the base insulating layer may include an inorganic insulating material.

The first insulating layer IIL1 may cover the first conductive layer ICL1. The second conductive layer ICL2 is disposed on the first insulating layer IIL1. A structure in which the input sensing layer ISL includes the first and second conductive layers ICL1 and ICL2 is illustrated, but the present invention is not limited thereto. For example, the input sensing layer ISL may include only one of the first and second conductive layers ICL1 and ICL2.

The second insulating layer IIL2 may be disposed on the second conductive layer ICL2. The second insulating layer IIL2 may include an organic insulating material. The second insulating layer IIL2 may protect the first and second conductive layers ICL1 and ICL2 from moisture/oxygen, and may protect the first and second conductive layers ICL1 and ICL2 from foreign objects.

The color filter layer CFL may be disposed on the input sensing layer ISL. For example, the color filter layer CFL may be directly disposed on the second insulating layer IIL2. The color filter layer CFL may include a first color filter CF_R, a second color filter CF_G, and a third color filter. The first color filter CF_R has a first color. The second color filter CF_G has a second color, and the third color filter has a third color. For example, the first color may be red, the second color may be green, and the third color may be blue. The first color filter CF_R and the second color filter CF_G are illustrated in FIG. 6 as some of color filters.

The color filter layer CFL may further include a dummy color filter DCF. For example, the dummy color filter DCF may be disposed to correspond to the sensing area SA. The dummy color filter DCF may overlap the sensing area SA and the non-sensing area NSA. For example, the dummy color filter DCF may have the same color as one of the first to third color filters CF_R and CF_G. For example, the dummy color filter DCF may have the same green color as the second color filter CF_G. However, the present invention is not limited thereto. The color filter layer CFL might not include the dummy color filter DCF.

The color filter layer CFL may further include a black matrix BM. The black matrix BM may be disposed to correspond to the non-pixel area NPA. The black matrix BM may be disposed to overlap the first and second conductive layers ICL1 and ICL2 in the non-pixel area NPA. For example, the black matrix BM may overlap the non-pixel area NPA and the first to third non-emission areas NPXA-R, NPXA-B, and NPXA-G. The black matrix BM may overlap the non-sensing area NSA and the non-pixel area NPA. The black matrix BM might not overlap the sensing area SA. For example, a portion of the first color filter CF_R and a portion of the second color filter CF_G may overlap the black matrix BM. In addition, a portion of the first color filter CF_R and a portion of the dummy color filter DCF may overlap the black matrix BM. However, the present invention is not limited thereto, and the first and second color filters CF_R and CF_G and the dummy color filter DCF might not overlap the black matrix BM.

The color filter layer CFL may further include an overcoat layer OCL. The overcoat layer OCL may include an organic insulating material. The overcoat layer OCL may be provided to be thick enough to remove a step between the first color filter CF_R, the second color filter CF_G, and the dummy color filter DCF. For example, the overcoat layer OCL may provide a planarized surface. A material of the overcoat layer OCL might not be specially limited as long as the material is capable of planarizing an upper surface of the color filter layer CFL with a given thickness and may include, for example, an acrylate-based organic material.

The window WM may be disposed on the color filter layer CFL.

Figure 7A:
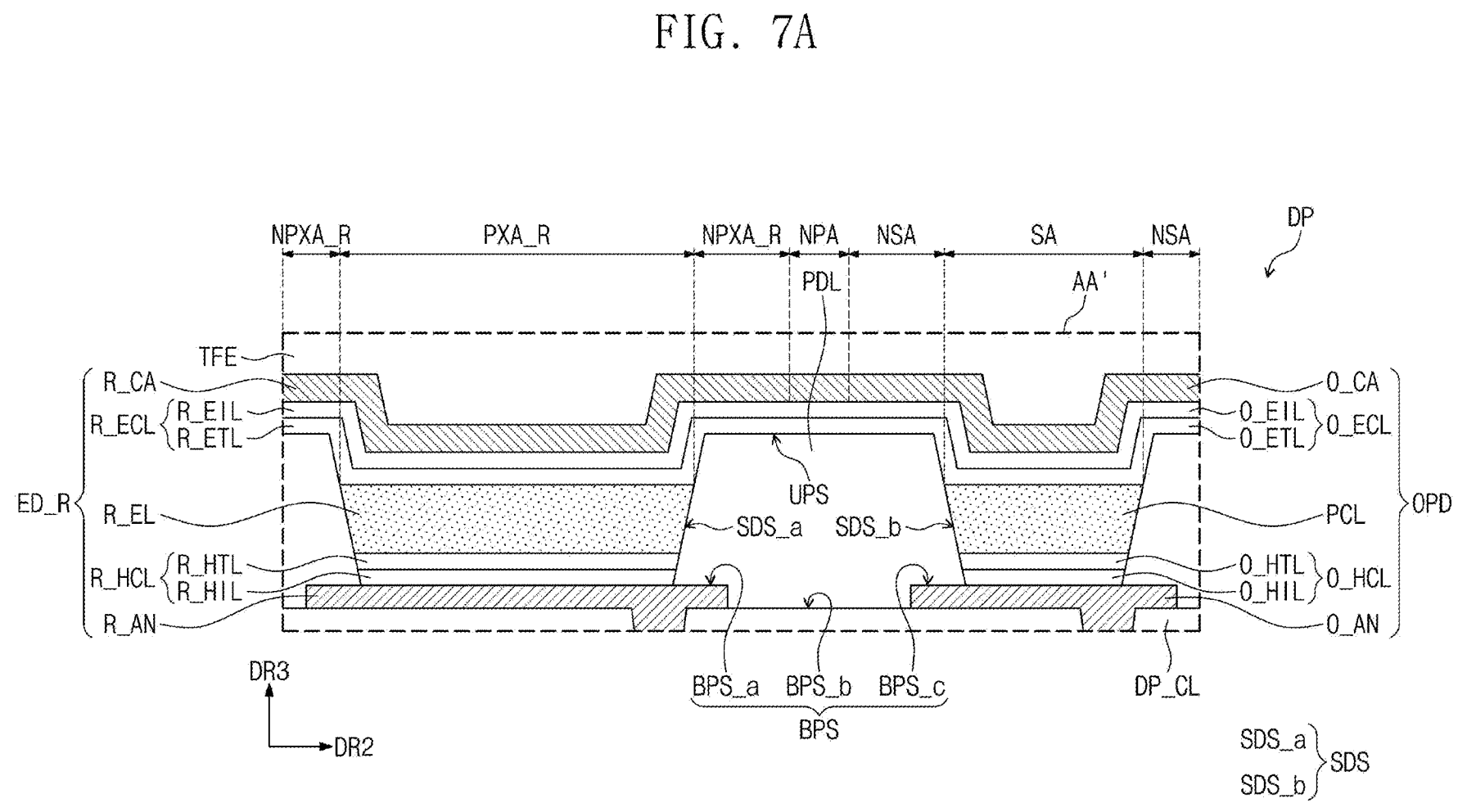
Figure 7B:
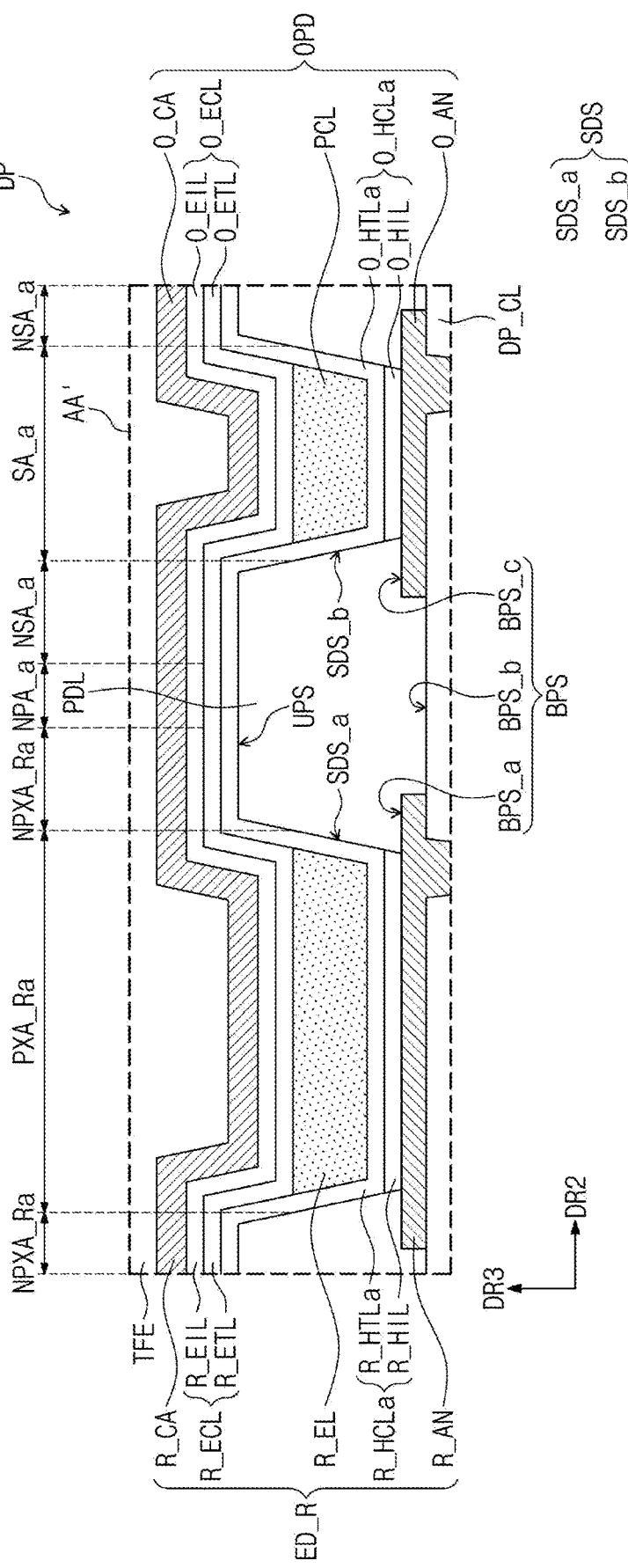
Figure 7C:
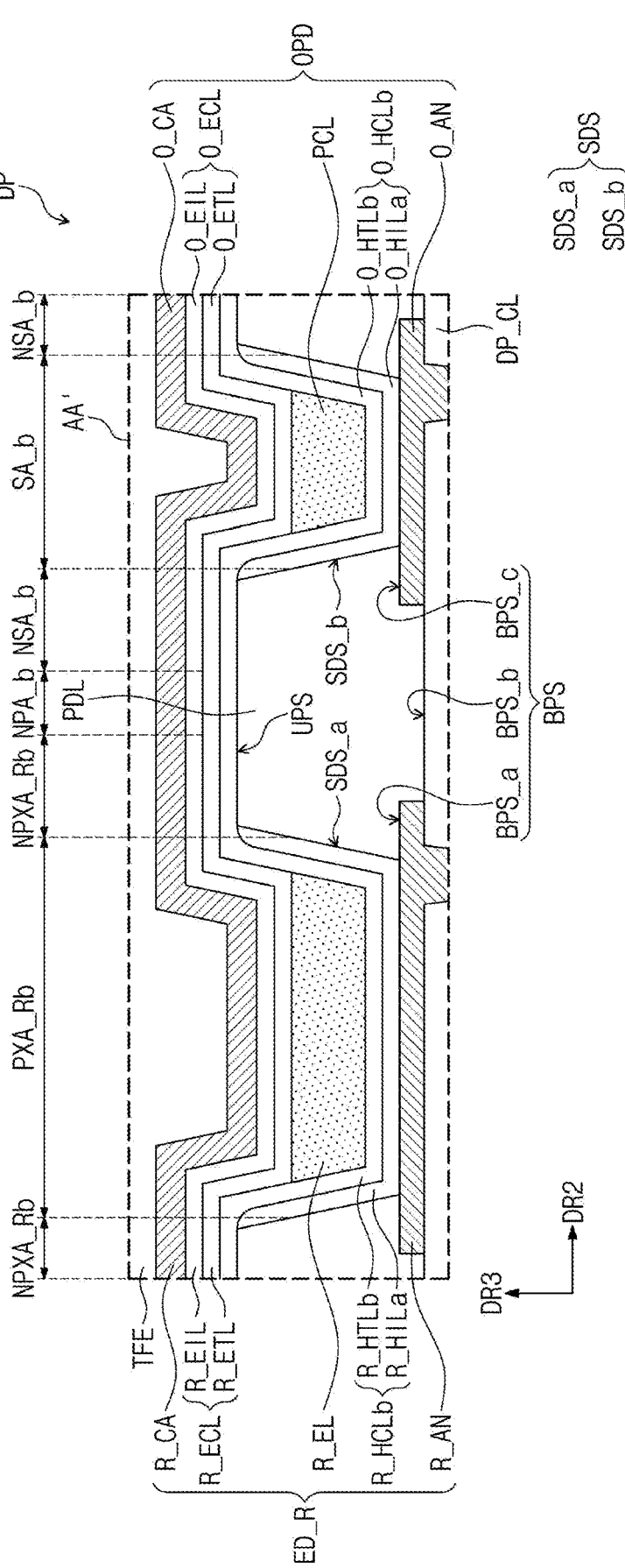

FIGS. 7A to 7C are enlarged cross-sectional views of a display panel in area AA' illustrated in FIG. 6.

Referring to FIGS. 6 to 7C, the circuit layer DP_CL, the red light-emitting element ED_R, the light sensing element OPD, the element defining layer PDL, and the encapsulation layer TFE, which are included in the display panel DP, are illustrated in FIG. 7A. Below, components that are the same as the components described with reference to FIG. 6 are marked by the same reference signs, and thus, additional description will be omitted to avoid redundancy.

For example, the element defining layer PDL separates the red light-emitting element ED_R and the light sensing element OPD. For example, the red light-emitting element ED_R and the light sensing element OPD may be spaced from each other in the second direction DR2 with respect to the element defining layer PDL and may be disposed on the circuit layer DP_CL. The red light-emitting element ED_R and the light sensing element OPD may be spaced from each other in the first direction DR1 and the second direction DR2 with respect to the element defining layer PDL, on a plane parallel to the first direction DR1 and the second direction DR2 and may be disposed on the circuit layer DP_CL.

The element defining layer PDL includes a bottom surface BPS, an upper surface UPS, and side surface SDS. The bottom surface BPS faces the circuit layer DP_CL. The upper surface UPS is opposite to the bottom surface BPS, and the side surface SDS connects the bottom surface BPS and the upper surface UPS to each other. For example, the bottom surface BPS may be a surface being in contact with the circuit layer DP_CL. The upper surface UPS may be a surface being in contact with the pixel electron auxiliary layer R_ECL and the sensing electron auxiliary layer O_ECL. For example, the bottom surface BPS includes a first bottom surface BPS_a, a second bottom surface BPS_b, and a third bottom surface BPS_c. The first bottom surface BPS_a may be in contact with the red anode electrode R_AN. The second bottom surface BPS_b may be in contact with the circuit layer DP_CL, and the third bottom surface BPS_c may be in contact with the sensing anode electrode O_AN. The side surface SDS includes a first side surface SDS_a and a second side surface SDS_b. The first side surface SDS_a connects the first bottom surface BPS_a and the upper surface UPS to each other. The second side surface SDS_b connects the third bottom surface BPS_c and the upper surface UPS to each other.

Referring to FIG. 7A, the red light-emitting element ED_R includes the red anode electrode R_AN, the red hole auxiliary layer R_HCL, the red emissive layer R_EL, the red electron auxiliary layer R_ECL, and the red cathode electrode R_CA. For example, the red hole auxiliary layer R_HCL includes a red hole injection layer R_HIL and a red hole transport layer R_HTL. For example, the red electron auxiliary layer R_ECL includes a red electron transport layer R_ETL and a red electron injection layer R_EIL. For example, the absolute value of the workfunction of the red hole injection layer R_HIL is greater than the absolute value of the workfunction of the red anode electrode R_AN. The absolute value of the workfunction of the red hole transport layer R_HTL is greater than the absolute value of the workfunction of the red hole injection layer R_HIL. The red hole injection layer R_HIL and the red hole transport layer R_HTL may increase the efficiency at which holes moves from the red anode electrode R_AN to the red emissive layer R_EL. The absolute value of the workfunction of the red electron injection layer R_EIL is smaller than the absolute value of the workfunction of the red cathode electrode R_CA. The absolute value of the workfunction of the red electron transport layer R_ETL is smaller than the absolute value of the workfunction of the red electron injection layer R_EIL. The red electron injection layer R_EIL and the red electron transport layer R_ETL may increase the efficiency at which electrons moves from the red cathode electrode R_CA to the red emissive layer R_EL.

For example, the red hole injection layer R_HIL is disposed on the red anode electrode R_AN. The red hole transport layer R_HTL is disposed on the red hole injection layer R_HIL. The red emissive layer R_EL is disposed on the red hole transport layer R_HTL. The red electron transport layer R_ETL is disposed on the red emissive layer R_EL. The red electron injection layer R_EIL is disposed on the red electron transport layer R_ETL. The red cathode electrode R_CA is disposed on the red electron injection layer R_EIL.

For example, the red hole injection layer R_HIL and the red hole transport layer R_HTL are disposed in the red emission area PXA_R. A portion (e.g., a lower surface) of the red hole injection layer R_HIL is disposed on the red anode electrode R_AN, and another portion (e.g., a side surface) of the red hole injection layer R_HIL is disposed on the first side surface SDS_a of the element defining layer PDL. A portion of the red hole transport layer R_HTL is disposed on the red hole injection layer R_HIL, and another portion of the red hole transport layer R_HTL is disposed on the first side surface SDS_a of the element defining layer PDL. Each of the red hole injection layer R_HIL and the red hole transport layer R_HTL is not disposed on the upper surface UPS of the element defining layer PDL. Each of the red hole injection layer R_HIL and the red hole transport layer R_HTL does not overlap the second bottom surface BPS_b of the element defining layer PDL. For example, the red hole injection layer R_HIL and the red hole transport layer R_HTL are not in contact with the first bottom surface BPS_a of the element defining layer PDL.

The light sensing element OPD includes the sensing anode electrode O_AN, the sensing hole auxiliary layer O_HCL, the photoelectric conversion layer PCL, the sensing electron auxiliary layer O_ECL, and the sensing cathode electrode O_CA. For example, the sensing hole auxiliary layer O_HCL includes a sensing hole injection layer O_HIL and a sensing hole transport layer O_HTL. For example, the sensing electron auxiliary layer O_ECL includes a sensing electron transport layer O_ETL and a sensing electron injection layer O_EIL. For example, the absolute value of the workfunction of the sensing hole injection layer O_HIL is greater than the absolute value of the workfunction of the sensing anode electrode O_AN. The absolute value of the workfunction of the sensing hole transport layer O_HTL is greater than the absolute value of the workfunction of the sensing hole injection layer O_HIL. The sensing hole injection layer O_HIL and the sensing hole transport layer O_HTL may increase the efficiency at which holes moves from the sensing anode electrode O_AN to the photoelectric conversion layer PCL. The absolute value of the workfunction of the sensing electron injection layer O_EIL is smaller than the absolute value of the workfunction of the sensing cathode electrode O_CA. The absolute value of the workfunction of the sensing electron transport layer O_ETL is smaller than the absolute value of the workfunction of the sensing electron injection layer O_EIL. The sensing electron injection layer O_EIL and the sensing electron transport layer O_ETL may increase the efficiency at which electrons moves from the sensing cathode electrode O_CA to the photoelectric conversion layer PCL.

For example, the sensing hole injection layer O_HIL and the sensing hole transport layer O_HTL are disposed in the sensing area SA. A portion (e.g., a lower surface) of the sensing hole injection layer O_HIL is disposed on the sensing anode electrode O_AN, and another portion (e.g., a side surface) of the sensing hole injection layer O_HIL is disposed on the second side surface SDS_b of the element defining layer PDL. A portion of the sensing hole transport layer O_HTL is disposed on the sensing hole injection layer O_HIL, and another portion of the sensing hole transport layer O_HTL is disposed on the second side surface SDS_b of the element defining layer PDL. Each of the sensing hole injection layer O_HIL and the sensing hole transport layer O_HTL is not disposed on the upper surface UPS of the element defining layer PDL. Each of the sensing hole injection layer O_HIL and the sensing hole transport layer O_HTL does not overlap the second bottom surface BPS_b of the element defining layer PDL. For example, the sensing hole injection layer O_HIL and the sensing hole transport layer O_HTL are not in contact with the third bottom surface BPS_c of the element defining layer PDL.

For example, the red hole injection layer R_HIL and the sensing hole injection layer O_HIL are electrically insulated from each other. The red hole injection layer R_HIL and the sensing hole injection layer O_HIL are spaced from each other in the second direction DR2 with respect to the element defining layer PDL. The red hole injection layer R_HIL and the sensing hole injection layer O_HIL may be spaced from each other in the first direction DR1 and the second direction DR2 with respect to the element defining layer PDL, on a plane parallel to the first direction DR1 and the second direction DR2. Accordingly, an unintended leakage current may be prevented from flowing between the red anode electrode R_AN of the red light-emitting element ED_R and the sensing anode electrode O_AN of the light sensing element OPD through the red hole injection layer R_HIL and the sensing hole injection layer O_HIL. As such, the sensing accuracy of the display device DD (refer to FIG. 1) that measures biometric information of the user US (refer to FIG. 1) through the light sensing element OPD may be increased.

For example, the red electron transport layer R_ETL is disposed on the red emissive layer R_EL. The sensing electron transport layer O_ETL is disposed on the photoelectric conversion layer PCL. The red electron transport layer R_ETL and the sensing electron transport layer O_ETL may be electrically connected with each other. The red electron transport layer R_ETL and the sensing electron transport layer O_ETL may have an integrated shape. In this case, the red electron transport layer R_ETL and the sensing electron transport layer O_ETL may be disposed in the red emission area PXA_R, the red non-emission area NPXA_R, the sensing area SA, the non-sensing area NSA, and the non-pixel area NPA. For example, a portion of the red electron transport layer R_ETL and a portion of the sensing electron transport layer O_ETL overlap the upper surface UPS, the first side surface SDS_a, and the second side surface SDS_b of the element defining layer PDL. For example, a portion of the red electron transport layer R_ETL and a portion of the sensing electron transport layer O_ETL are in contact with the upper surface UPS, the first side surface SDS_a, and the second side surface SDS_b of the element defining layer PDL.

For example, the red electron injection layer R_EIL is disposed on the red electron transport layer R_ETL. The sensing electron injection layer O_EIL is disposed on the sensing electron transport layer O_ETL. The red electron injection layer R_EIL and the sensing electron injection layer O_EIL may be electrically connected with each other. The red electron injection layer R_EIL and the sensing electron injection layer O_EIL may have an integrated shape. In this case, the red electron injection layer R_EIL and the sensing electron injection layer O_EIL may be disposed in the red emission area PXA_R, the red non-emission area NPXA_R, the sensing area SA, the non-sensing area NSA, and the non-pixel area NPA. For example, a portion of the red electron injection layer R_EIL and a portion of the sensing electron injection layer O_EIL overlap the upper surface UPS, the first side surface SDS_a, and the second side surface SDS_b of the element defining layer PDL.

For example, the red cathode electrode R_CA is disposed on the red electron injection layer R_EIL. The sensing cathode electrode O_CA disposed on the sensing electron injection layer O_EIL. The red cathode electrode R_CA and the sensing cathode electrode O_CA may be electrically connected with each other. The red cathode electrode R_CA and the sensing cathode electrode O_CA may have an integrated shape. A portion of the red cathode electrode R_CA and a portion of the sensing cathode electrode O_CA overlap the upper surface UPS, the first side surface SDS_a, and the second side surface SDS_b of the element defining layer PDL.

Referring to FIGS. 6 and 7B, the red light-emitting element ED_R of FIG. 7B includes the red anode electrode R_AN, a red hole auxiliary layer R_HCLa, the red emissive layer R_EL, the red electron transport layer R_ETL, the red electron injection layer R_EIL, and the red cathode electrode R_CA. The red hole auxiliary layer R_HCLa includes the red hole injection layer R_HIL and a red hole transport layer R_HTLa. The light sensing element OPD of FIG. 7B includes the sensing anode electrode O_AN, a sensing hole auxiliary layer O_HCLa, the photoelectric conversion layer PCL, the sensing electron transport layer O_ETL, the sensing electron injection layer O_EIL, and the sensing cathode electrode O_CA. The sensing hole auxiliary layer O_HCLa includes the sensing hole injection layer O_HIL and a sensing hole transport layer O_HTLa. Below, components that are the same as the components described with reference to FIGS. 6 and 7A are marked by the same reference signs, and thus, additional description will be omitted to avoid redundancy.

For example, the red hole injection layer R_HIL is disposed on the red anode electrode R_AN. The red hole injection layer R_HIL is disposed in a red emission area PXA_Ra. The sensing hole injection layer O_HIL is disposed on the sensing anode electrode O_AN. The sensing hole injection layer O_HIL is disposed in a sensing area SA_a. For example, the red hole injection layer R_HIL and the sensing hole injection layer O_HIL are electrically insulated from each other. Accordingly, an unintended leakage current may be prevented from flowing between the red anode electrode R_AN of the red light-emitting element ED_R and the sensing anode electrode O_AN of the light sensing element OPD through the red hole injection layer R_HIL and the sensing hole injection layer O_HIL.

For example, the red hole transport layer R_HTLa is disposed on the red hole injection layer R_HIL. The sensing hole transport layer O_HTLa is disposed on the sensing hole injection layer O_HIL. The red hole transport layer R_HTLa and the sensing hole transport layer O_HTLa may be electrically connected with each other. The red hole transport layer R_HTLa and the sensing hole transport layer O_HTLa may have an integrated shape. In this case, the red hole transport layer R_HTLa and the sensing hole transport layer O_HTLa may be disposed in a red emission area PXA_Ra, a red non-emission area NPXA_Ra, a sensing area SA_a, a non-sensing area NSA_a, and a non-pixel area NPA_a. For example, a portion of the red hole transport layer R_HTLa and a portion of the sensing hole transport layer O_HTLa overlap the upper surface UPS, the first side surface SDS_a, and the second side surface SDS_b of the element defining layer PDL. For example, a portion of the red hole transport layer R_HTLa and a portion of the sensing hole transport layer O_HTLa are in contact with the upper surface UPS, the first side surface SDS_a, and the second side surface SDS_b of the element defining layer PDL.

The red emissive layer R_EL is disposed on the red hole transport layer R_HTLa. The photoelectric conversion layer PCL is disposed on the sensing hole transport layer O_HTLa.

The red electron transport layer R_ETL is disposed on the red emissive layer R_EL and the red hole transport layer R_HTLa. The sensing electron transport layer O_ETL is disposed on the photoelectric conversion layer PCL and the sensing hole transport layer O_HTLa. The red electron transport layer R_ETL and the sensing electron transport layer O_ETL are electrically connected to each other.

Referring to FIGS. 6 and 7C, the red light-emitting element ED_R of FIG. 7C includes the red anode electrode R_AN, a red hole auxiliary layer R_HCLb, the red emissive layer R_EL, the red electron transport layer R_ETL, the red electron injection layer R_EIL, and the red cathode electrode R_CA. The red hole auxiliary layer R_HCLb includes a red hole injection layer R_HILa and a red hole transport layer R_HTLb. The light sensing element OPD of FIG. 7C includes the sensing anode electrode O_AN, a sensing hole auxiliary layer O_HCLb, the photoelectric conversion layer PCL, the sensing electron transport layer O_ETL, the sensing electron injection layer O_EIL, and the sensing cathode electrode O_CA. The sensing hole auxiliary layer O_HCLb includes a sensing hole injection layer O_HILa and a sensing hole transport layer O_HTLb. Below, components that are the same as the components described with reference to FIGS. 6 and 7A are marked by the same reference signs, and thus, additional description will be omitted to avoid redundancy.

For example, the red hole injection layer R_HILa is disposed on the red anode electrode R_AN. The red hole injection layer R_HILa is disposed in a red emission area PXA_Rb and a red non-emission area NPXA_Rb. For example, a first portion of the red hole injection layer R_HILa is disposed on the red anode electrode R_AN, and a second portion of the red hole injection layer R_HILa is disposed on the first side surface SDS_a of the element defining layer PDL. For example, as the second portion of the red hole injection layer R_HILa goes toward the upper surface UPS of the element defining layer PDL, a thickness of the red hole injection layer R_HILa disposed on the first side surface SDS_a becomes thinner.

The sensing hole injection layer O_HILa is disposed on the sensing anode electrode O_AN. The sensing hole injection layer O_HILa is disposed in a sensing area SA_b and a non-sensing area NSA_b. For example, a first portion of the sensing hole injection layer O_HILa is disposed on the sensing anode electrode O_AN, and a second portion of the sensing hole injection layer O_HILa is disposed on the second side surface SDS_b of the element defining layer PDL. For example, as the second portion of the sensing hole injection layer O_HILa goes toward the upper surface UPS of the element defining layer PDL, a thickness of the sensing hole injection layer O_HILa disposed on the second side surface SDS_b becomes thinner.

For example, the red hole injection layer R_HILa and the sensing hole injection layer O_HILa are electrically insulated from each other. The red hole injection layer R_HILa and the sensing hole injection layer O_HILa do not overlap the upper surface UPS of the element defining layer PDL. The red hole injection layer R_HILa and the sensing hole injection layer O_HILa are not disposed on the upper surface UPS. Accordingly, an unintended leakage current may be prevented from flowing between the red anode electrode R_AN of the red light-emitting element ED_R and the sensing anode electrode O_AN of the light sensing element OPD through the red hole injection layer R_HIL and the sensing hole injection layer O_HIL.

Figure 8B:
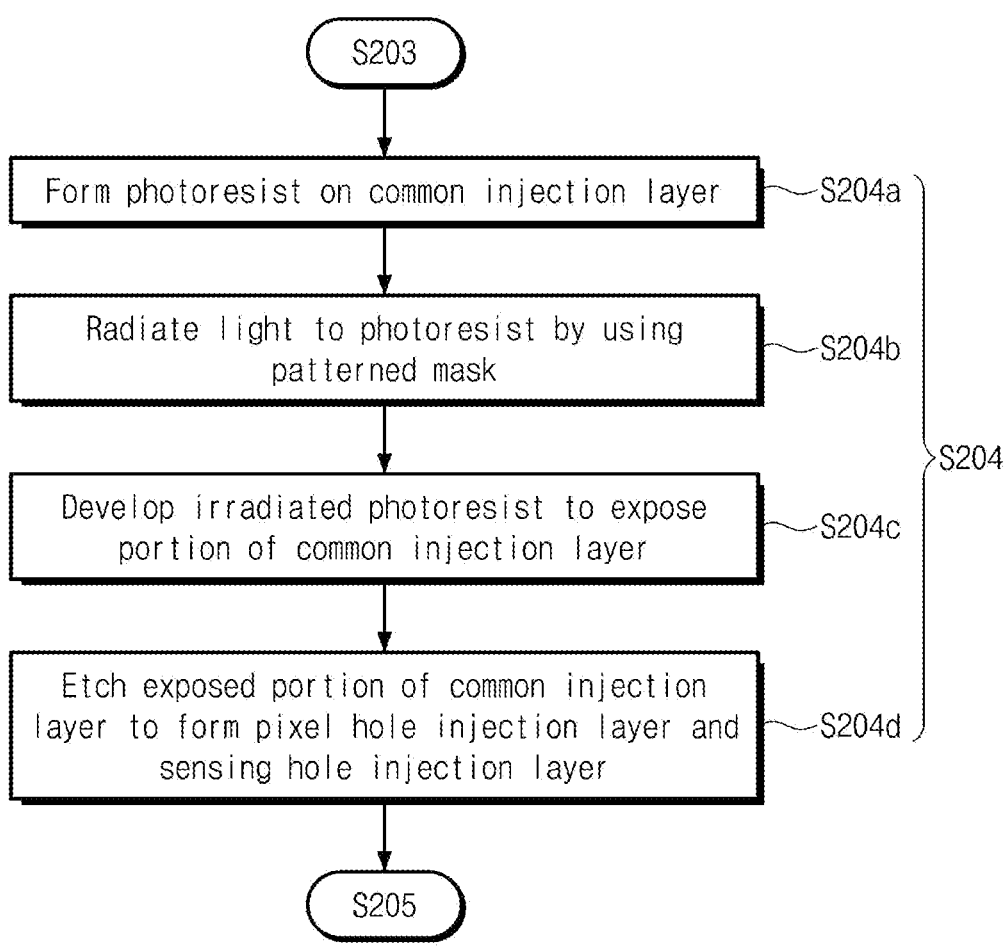
FIG. 8B is a flowchart for describing how a pixel hole injection layer and a sensing hole injection layer are formed, according to an embodiment of the present invention.
Figure 9A:
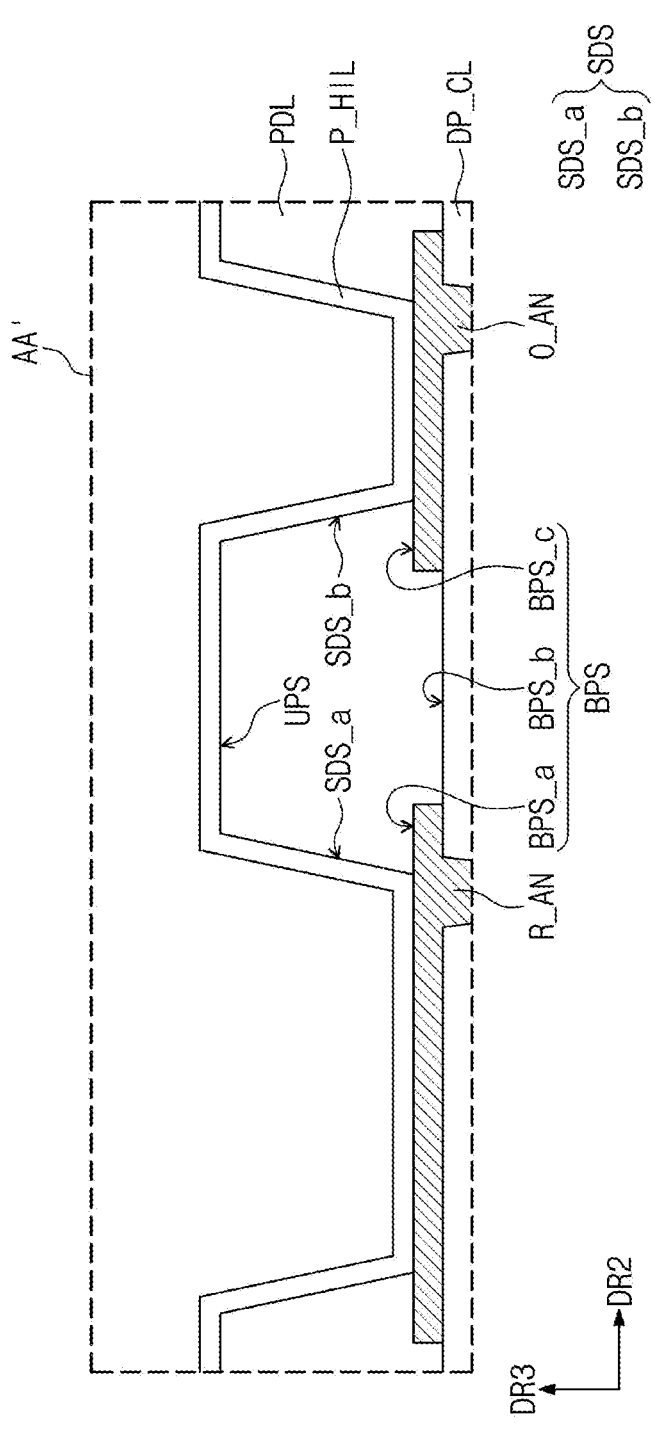
Figure 9B:
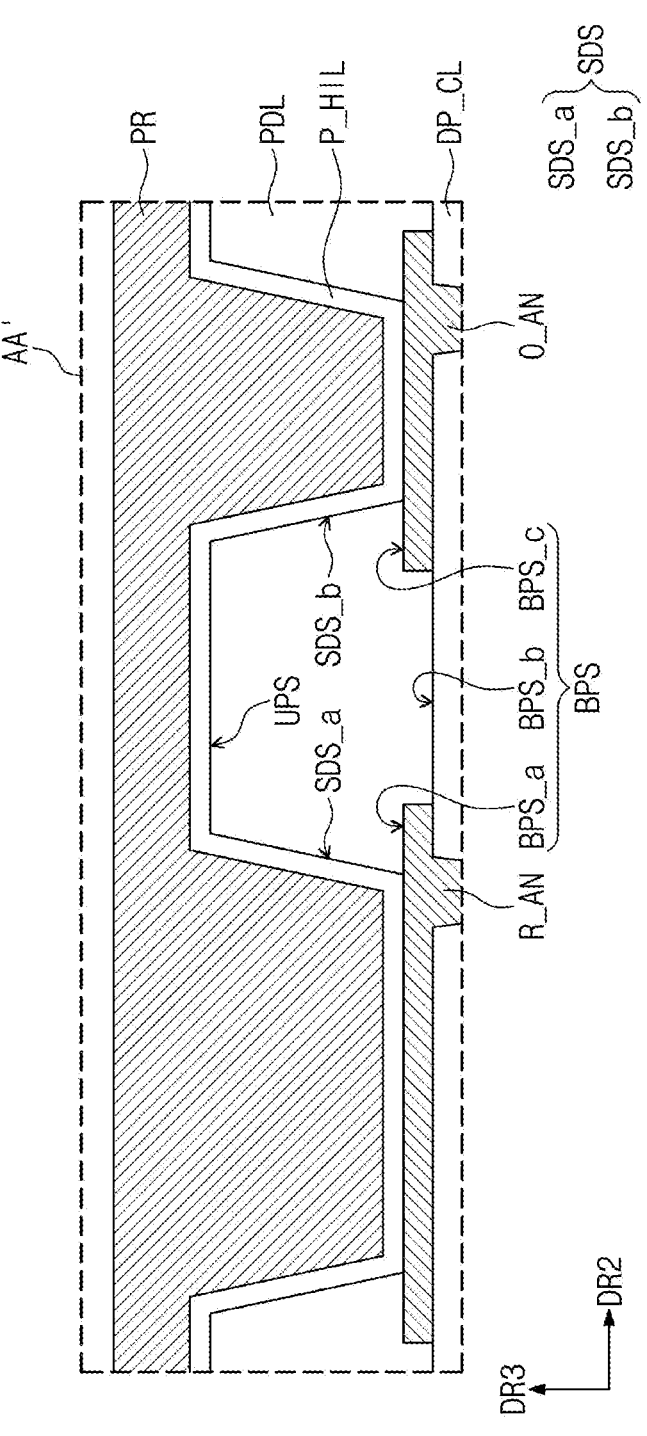
Figure 9C:
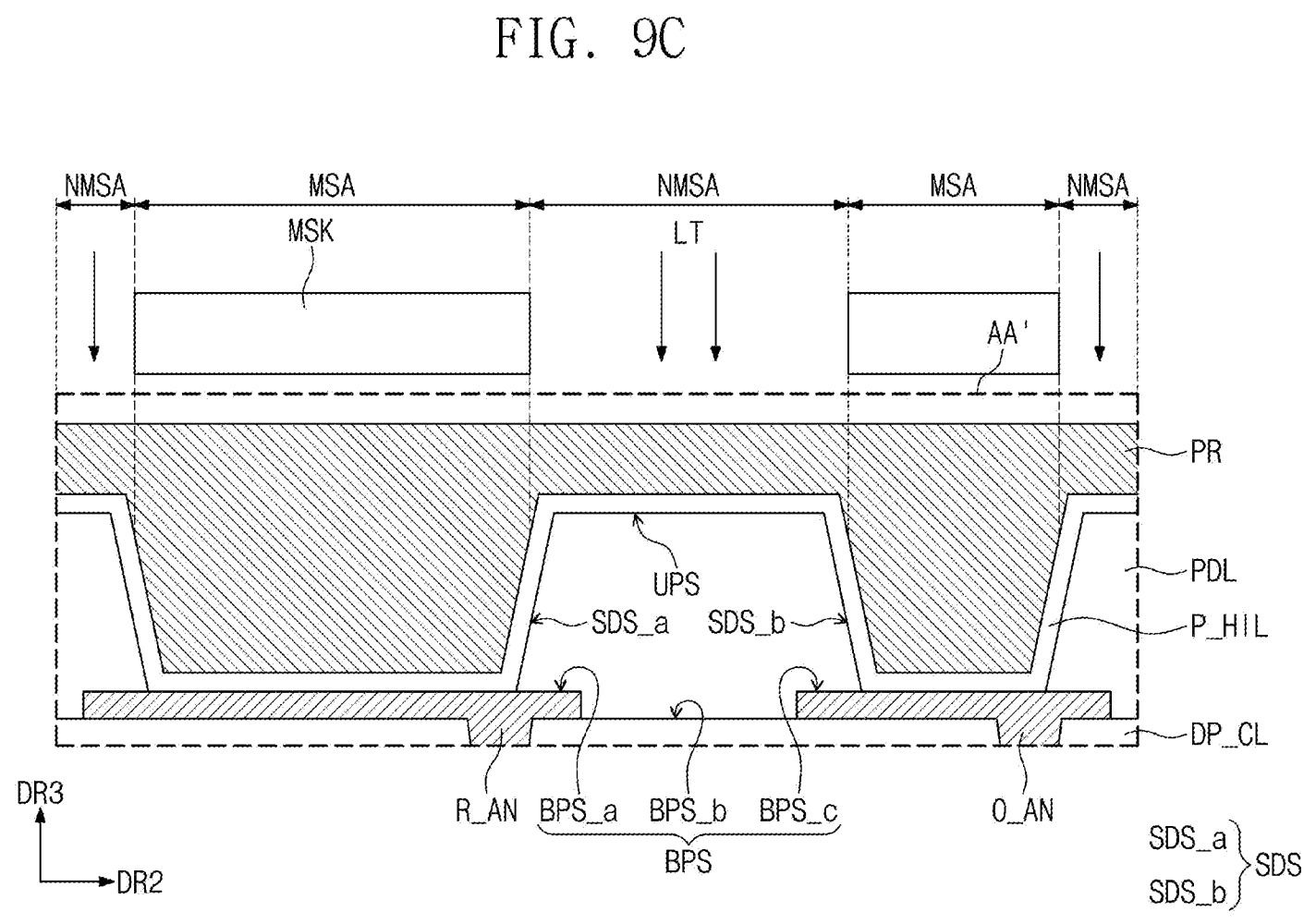
Figure 9D:
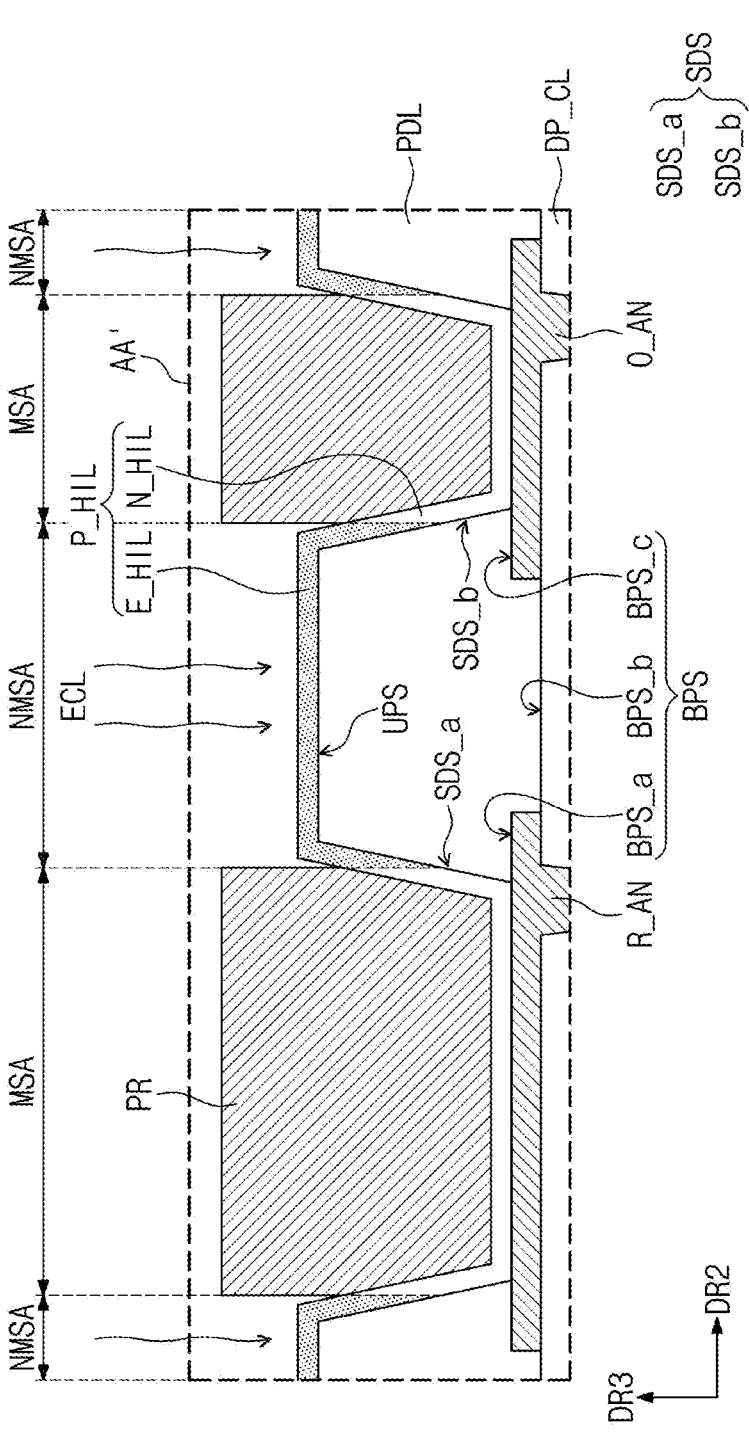
Figure 9E:
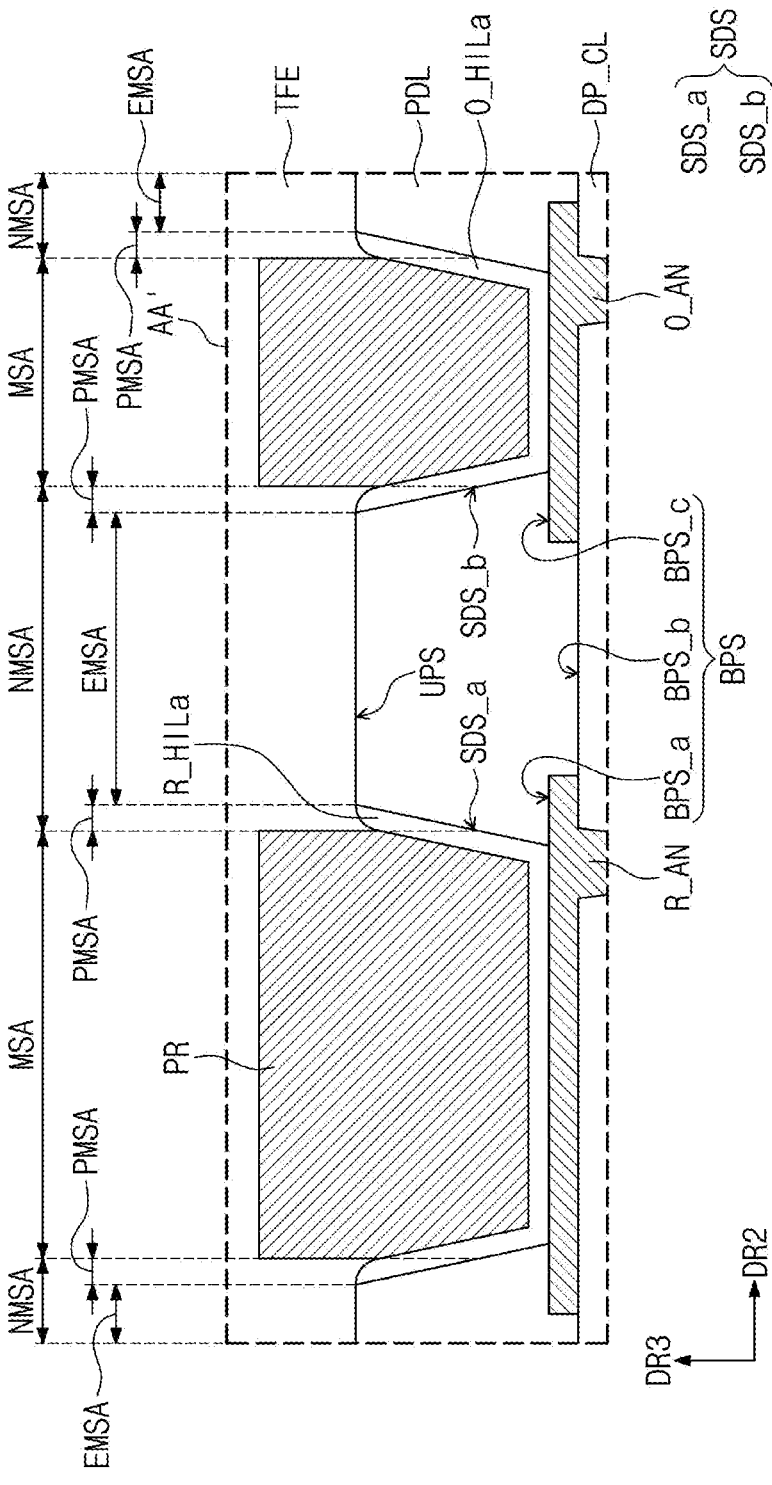
Figure 9F:
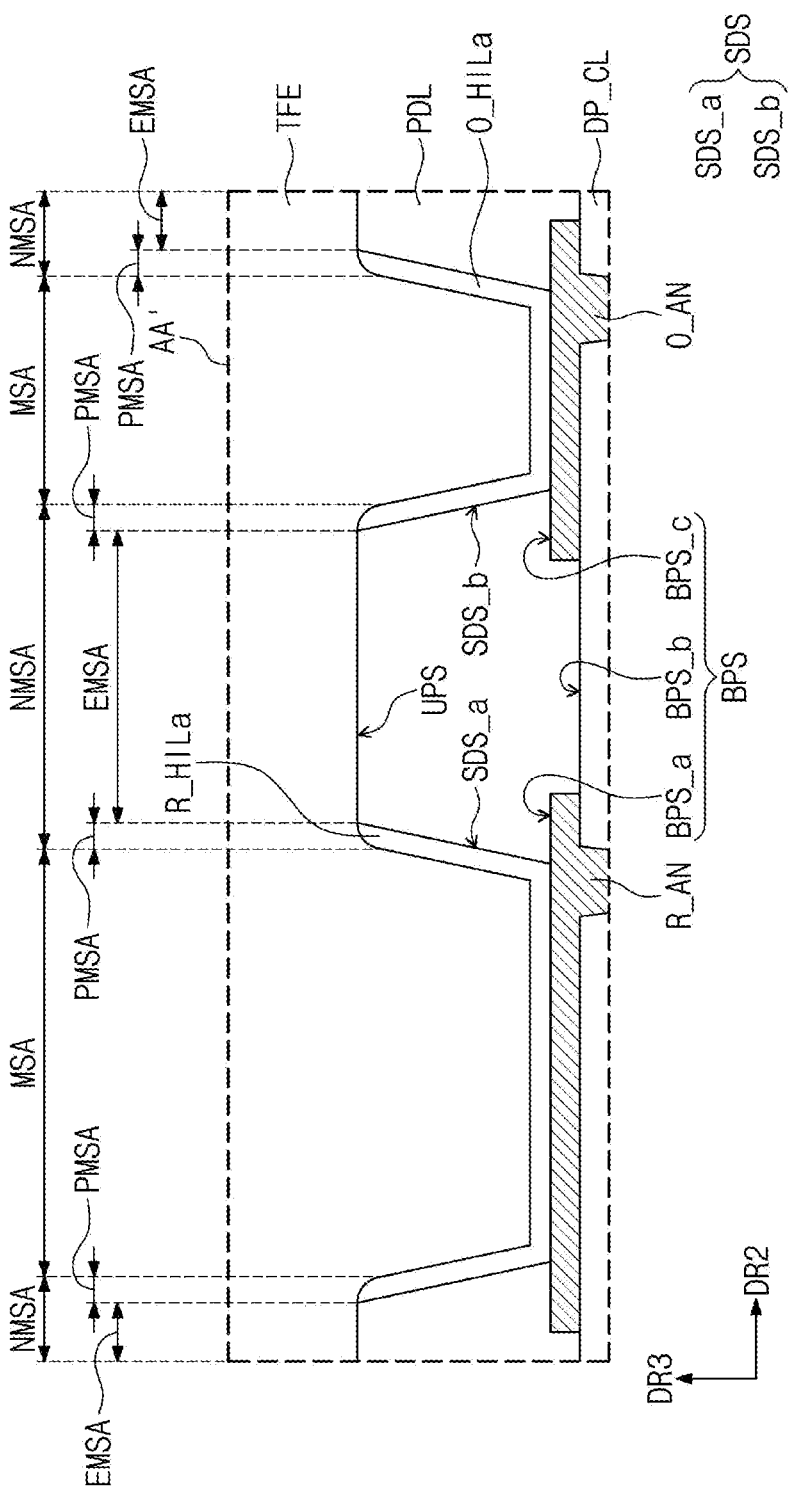

FIG. 8A is a flowchart illustrating a method of describing a display device manufacturing method according to an embodiment of the present invention. FIG. 8B is a flowchart for describing how a pixel hole injection layer and a sensing hole injection layer are formed, according to an embodiment of the present invention. FIGS. 9A to 9F are cross-sectional views for describing how a pixel hole injection layer and a sensing hole injection layer are formed, according to an embodiment of the present invention. Below, components that are the same as the components described with reference to FIGS. 6 and 7A are marked by the same reference signs, and thus, additional description will be omitted to avoid redundancy.

For convenience of description, a method of manufacturing the display device DD (refer to FIG. 1) including the display panel DP (refer to FIG. 7C) having the structure illustrated in FIG. 7C is illustrated in FIGS. 8A and 8B as an embodiment of the present invention. However, the present invention is not limited thereto. One skilled in the art would know that various display panels with a structure including the scope and spirit of the invention as well as the structures of FIGS. 7A and 7B are able to be manufactured from the method illustrated in FIGS. 8A and 8B.

Referring to FIGS. 6, 7C, and 8A, the method of manufacturing the display device DD (refer to FIG. 1) of the present invention includes disposing the circuit layer DP_CL on the base layer BL (S100), and disposing the element layer DP_ED, which includes the light-emitting element ED (refer to FIG. 5), the light sensing element OPD, and the element defining layer PDL separating the light-emitting element ED and the light sensing element OPD from each other on the circuit layer DP_CL (S200). Below, for convenience of description, it is assumed that the light-emitting element ED refers to the red light-emitting element ED_R.

For example, the disposing of the element layer DP_ED includes disposing the pixel anode electrode P_AN and the sensing anode electrode O_AN on the circuit layer DP_CL (S201). Below, for convenience of description, it is assumed that the pixel anode electrode P_AN refers to the red anode electrode R_AN. The disposing of the element layer DP_ED includes disposing the element defining layer PDL on the red anode electrode R_AN, the sensing anode electrode O_AN, and the circuit layer DP_CL (S202). The disposing of the element layer DP_ED includes a common injection layer P_HIL (refer to FIG. 9A) on the red anode electrode R_AN, the sensing anode electrode O_AN, and the element defining layer PDL (S203).

The disposing of the element layer DP_ED includes etching the common injection layer P_HIL to form a pixel hole injection layer disposed on the red anode electrode R_AN and the sensing hole injection layer O_HILa disposed on the sensing anode electrode O_AN (S204). Below, for convenience of description, it is assumed that the pixel hole injection layer refers to the red hole injection layer R_HILa. The forming of the red hole injection layer R_HILa and the sensing hole injection layer O_HILa (S204) will be described with reference to FIGS. 8B and 9A to 9F.

The disposing of the element layer DP_ED includes disposing the emissive layer on the red hole injection layer R_HILa and disposing the photoelectric conversion layer PCL (refer to FIG. 7C) on the sensing hole injection layer O_HILa (S205). Below, for convenience of description, it is assumed that the emissive layer refers to the red emissive layer R_EL (refer to FIG. 7C). The disposing of the element layer DP_ED (refer to FIG. 7C) includes disposing the red cathode electrode R_CA (refer to FIG. 7C) on the red emissive layer R_EL and disposing the sensing cathode electrode O_CA (refer to FIG. 7C) on the photoelectric conversion layer PCL (S206).

For example, the method of manufacturing the display device DD may further include disposing the encapsulation layer TFE (refer to FIG. 7C) on the red cathode electrode R_CA and the sensing cathode electrode O_CA, disposing the input sensing layer ISL on the encapsulation layer TFE, disposing the color filter layer CFL on the input sensing layer ISL, and disposing the window WM on the color filter layer CFL.

Referring to FIGS. 7C, 8A, 8B, and 9A, the common injection layer P_HIL may include a material having the absolute value of the workfunction, which is greater than the absolute value of the workfunction of each of the red anode electrode R_AN and the sensing anode electrode O_AN. For example, the common injection layer P_HIL may include a metal oxide material. For example, the red anode electrode R_AN and the sensing anode electrode O_AN may be formed of a metal alloy or a conductive compound. The red anode electrode R_AN and the sensing anode electrode O_AN include, for example, Ag, Mg, Cu, Al, Pt, Pd, Au, Ni, Nd, Ir, Cr, Li, Ca, LiF/Ca, LiF/Al, Mo, T1, a compound thereof, or a mixture thereof (e.g., a mixture of Ag and Mg). In addition, the red anode electrode R_AN and the sensing anode electrode O_AN may have a multi-layer structure including a reflection layer or a semi-transmission layer, which is formed of the above material, and a transparent conductive layer formed of, for example, indium tin oxide (ITO), indium zinc oxide (IZO), zinc oxide (ZnO), indium tin zinc oxide (ITZO), or the like. For example, the red anode electrode R_AN and the sensing anode electrode O_AN may have a three-layer structure of ITO/Ag/ITO, but the present invention is not limited thereto. The common injection layer P_HIL may include, for example, tungsten oxide (WOx) or molybdenum oxide (MoOx).

For example, the common injection layer P_HIL may be disposed on the red anode electrode R_AN, the sensing anode electrode O_AN, and the element defining layer PDL through physical vapor deposition. For example, the common injection layer P_HIL may be formed in common.

Referring to FIGS. 7C, 8A, 8B, and 9B, the forming of the red hole injection layer R_HILa and the sensing hole injection layer O_HILa (S204) includes forming a photoresist PR on the common injection layer P_HIL (S204*a*). The photoresist PR includes a photosensitive material whose characteristic changes in response to a light.

Referring to FIGS. 7C, 8A, 8B, and 9C, the forming of the red hole injection layer R_HTLa and the sensing hole injection layer O_HILa (S204) includes emitting a light LT to the photoresist PR by using a patterned mask MSK (S204*b*). A portion of the photoresist PR, which is exposed to the light LT, and a portion of the photoresist PR, which is not exposed to the light LT, are different in characteristic. Accordingly, when the mask MSK that is patterned to include a partially opened light blocking film is disposed over the photoresist PR and then an exposure process of radiating the light LT to the photoresist PR is performed, the exposed portion of the photoresist PR may be exposed to the light LT. For example, an area of the photoresist PR that is not radiated with the light LT because it is blocked by the mask MSK is referred to as a "masking area MSA". An area of the photoresist PR that is radiated with the light LT through the opening of the mask MSK is referred to as a "non-masking area NMSA". As an embodiment of the present invention, the non-masking area NMSA may overlap the element defining layer PDL. The non-masking area NMSA may overlap the upper surface UPS of the element defining layer PDL, a portion of the first side surface SDS_a of the element defining layer PDL, and a portion of the second side surface SDS_b of the element defining layer PDL. The non-masking area NMSA does not overlap the red emissive layer R_EL and the photoelectric conversion layer PCL.

For example, the photoresist PR that is used in an embodiment of the present invention may be a positive photoresist PR in which a bonding force of a light-irradiated portion becomes weak. However, the present invention is not limited thereto. In the case where the photoresist PR that is used in the present invention is a negative photoresist PR in which a bonding force of a light-irradiated portion becomes strong, a pattern of the mask MSK may change to be appropriate for the case.

Referring to FIGS. 7C, 8A, 8B, 9D, and 9E, the forming of the red hole injection layer R_HILa and the sensing hole injection layer O_HILa (S204) includes developing the irradiated photoresist to expose a portion E_HIL of the common injection layer P_HIL (S204c), and etching the exposed common injection layer E_HIL to form the red hole injection layer R_HILa and the sensing hole injection layer O_HILa (S204d).

For example, an irradiated portion of the photoresist PR, which overlaps the non-masking area NMSA, may be developed and removed. In this case, the common injection layer P_HIL include a first common injection layer E_HIL, which is exposed from the photoresist PR, and a second common injection layer N_HIL, which is covered by the photoresist PR. For example, the first common injection layer E_HIL may overlap the element defining layer PDL. For example, the first common injection layer E_HIL may overlap the upper surface UPS of the element defining layer PDL, a portion of the first side surface SDS_a of the element defining layer PDL, and a portion of the second side surface SDS_b of the element defining layer PDL.

For example, an etching solution ECL may be applied to the first common injection layer E_HIL to etch the first common injection layer E_HIL. For example, the first common injection layer E_HIL may be etched in a wet etching manner. For example, the etching solution ECL may include tetramethylammonium hydroxide (TMAH). However, the present invention is not limited thereto. For example, the etching solution ECL may be liquid capable of selectively etching the first common injection layer E_HIL.

For example, the non-masking area NMSA includes a first non-masking area PMSA, which is adjacent to the masking area MSA, and a second non-masking area EMSA, which is adjacent to the first non-masking area PMSA. For example, in etching the first common injection layer E_HIL (S204d), the first common injection layer E_HIL corresponding to the first non-masking area PMSA might not be completely etched. However, the first common injection layer E_HIL corresponding to the second non-masking area EMSA may be completely etched, and thus, the red hole injection layer R_HILa and the sensing hole injection layer O_HILa may be electrically insulated from each other.

Referring to FIGS. 7C, 8A, 8B, 9D, 9E and 9F, the forming of the red hole injection layer R_HILa and the sensing hole injection layer O_HILa (S204) may further include removing the photoresist PR (i.e., a non-irradiation photoresist PR) remaining after etching the first common injection layer E_HIL.

According to an embodiment of the present invention, the red hole injection layer R_HILa and the sensing hole injection layer O_HILa may be formed after forming the red anode electrode R_AN, the sensing anode electrode O_AN, and the element defining layer PDL. Accordingly, compared to the method of forming the red anode electrode R_AN, the sensing anode electrode O_AN, and the element defining layer PDL after forming the red hole injection layer R_HILa and the sensing hole injection layer O_HILa, the red hole injection layer R_HILa and the sensing hole injection layer O_HILa thus formed may be minimized from being damaged by the etching solution ECL that is used in a following process. Accordingly, the display quality of the pixels PX (refer to FIG. 3) may be increased, and the accuracy of biometric information that the photosensors FX (refer to FIG. 3) senses may be increased.

A display device according to an embodiment of the present invention includes a pixel hole injection layer and a sensing hole injection layer electrically insulated from each other. According to an embodiment of the present invention, a leakage current may be prevented from being introduced from the pixel hole injection layer when biometric information is measured through a light sensing element. Accordingly, the accuracy at which the display device senses biometric information may be increased.

In addition, a display device manufacturing method according to an embodiment of the present invention forms the pixel hole injection layer and the sensing hole injection layer after forming a pixel anode electrode, a sensing anode electrode, and an element defining layer. According to the display device manufacturing method according to an embodiment of the present invention, the pixel hole injection layer and the sensing hole injection layer thus formed may be prevented from being damaged by a following process. Accordingly, the display quality of the display device and the accuracy at which the display device senses biometric information may be increased.

While the present invention has been described with reference to embodiments thereof, it will be understood by those of ordinary skill in the art that various changes in form and details may be made thereto without departing from the spirit and scope of the present invention.

What is claimed is:

1. A display device comprising:
   a circuit layer; and
   an element layer disposed on the circuit layer and including a light-emitting element, a light sensing element, and an element defining layer separating the light-emitting element and the light sensing element from each other,
   wherein the light-emitting element includes:
   a pixel anode electrode electrically connected with the circuit layer;
   a pixel hole injection layer disposed on the pixel anode electrode;
   an emissive layer disposed on the pixel hole injection layer; and
   a pixel cathode electrode disposed on the emissive layer,
   wherein the light sensing element includes:
   a sensing anode electrode electrically connected with the circuit layer;
   a sensing hole injection layer disposed on the sensing anode electrode;
   a photoelectric conversion layer disposed on the sensing hole injection layer; and
   a sensing cathode electrode disposed on the photoelectric conversion layer,
   wherein the pixel hole injection layer and the sensing hole injection layer are electrically insulated from each other,
   wherein the pixel cathode electrode and the sensing cathode electrode are electrically connected with each other,
   wherein the pixel hole injection layer and the sensing hole injection layer are disposed on an uppermost portion of a side surface of the element defining layer, and
   wherein the pixel hole injection layer and the sensing hole injection layer do not overlap an upper surface of the element defining layer.

2. The display device of claim 1, wherein the circuit layer includes:
   a pixel driving circuit electrically connected with the light-emitting element, and controlling an operation of the light-emitting element; and a sensing driving circuit electrically connected with the light sensing element, and controlling an operation of the light sensing element.

3. The display device of claim 1, wherein the light-emitting element and the light sensing element are disposed on the same layer as each other.

4. The display device of claim 1, wherein the element defining layer includes:

a bottom surface facing the circuit layer;

the upper surface being opposite to the bottom surface; and the side surface connecting the bottom surface and the upper surface to each other.

5. The display device of claim 4, wherein a portion of the pixel cathode electrode and a portion of the sensing cathode electrode overlap the upper surface and the side surface of the element defining layer.

6. The display device of claim 4, wherein each of the pixel hole injection layer and the sensing hole injection layer does not overlap the bottom surface of the element defining layer.

7. The display device of claim 6, wherein each of the pixel hole injection layer and the sensing hole injection layer is not in contact with the bottom surface of the element defining layer.

8. The display device of claim 1, wherein the light-emitting element further includes:

a pixel hole transport layer disposed between the pixel hole injection layer and the emissive layer, and wherein the light sensing element further includes:

a sensing hole transport layer disposed between the sensing hole injection layer and the photoelectric conversion layer.

9. The display device of claim 8, wherein the pixel hole transport layer and the sensing hole transport layer are electrically insulated from each other.

10. The display device of claim 8, wherein the pixel hole transport layer and the sensing hole transport layer are electrically connected with each other.

11. The display device of claim 1, wherein the light-emitting element further includes:

a pixel electron transport layer disposed between the emissive layer and the pixel cathode electrode, wherein the light sensing element further includes:

a sensing electron transport layer disposed between the photoelectric conversion layer and the sensing cathode electrode, and wherein the pixel electron transport layer and the sensing electron transport layer are electrically connected with each other.

12. The display device of claim 11, wherein the light-emitting element further includes:

a pixel electron injection layer disposed between the pixel electron transport layer and the pixel cathode electrode, wherein the light sensing element further includes:

a sensing electron injection layer disposed between the photoelectric conversion layer and the sensing cathode electrode, and wherein the pixel electron transport layer and the sensing electron transport layer are electrically connected with each other.

13. The display device of claim 1, wherein an absolute value of a workfunction of the pixel hole injection layer is greater than an absolute value of a workfunction of the pixel anode electrode, wherein an absolute value of a workfunction of the sensing hole injection layer is greater than an absolute value of a workfunction of the sensing anode electrode, and wherein each of the pixel hole injection layer and the sensing hole injection layer includes metal oxide.

14. The display device of claim 13, wherein each of the pixel hole injection layer and the sensing hole injection layer includes tungsten oxide.

15. The display device of claim 13, wherein each of the pixel hole injection layer and the sensing hole injection layer includes molybdenum oxide.

16. An electronic device, comprising:

a display device comprising:

a circuit layer; and an element layer disposed on the circuit layer and including a light-emitting element, a light sensing element, and an element defining layer separating the light-emitting element and the light sensing element from each other, wherein the light-emitting element includes:

a pixel anode electrode electrically connected with the circuit layer;

a pixel hole injection layer disposed on the pixel anode electrode;

an emissive layer disposed on the pixel hole injection layer; and a pixel cathode electrode disposed on the emissive layer, wherein the light sensing element includes:

a sensing anode electrode electrically connected with the circuit layer;

a sensing hole injection layer disposed on the sensing anode electrode;

a photoelectric conversion layer disposed on the sensing hole injection layer; and a sensing cathode electrode disposed on the photoelectric conversion layer, wherein the pixel hole injection layer and the sensing hole injection layer are electrically insulated from each other, wherein the pixel cathode electrode and the sensing cathode electrode are electrically connected with each other, and wherein the pixel hole injection layer and the sensing hole injection layer are disposed on an uppermost portion of a side surface of the element defining layer, and wherein the pixel hole injection layer and the sensing hole injection layer do not overlap an upper surface of the element defining layer.

* * * * *